(12) United States Patent
Takayama et al.

(10) Patent No.: US 7,361,573 B2
(45) Date of Patent: Apr. 22, 2008

(54) METHOD OF PEELING OFF AND METHOD OF MANUFACTURING SEMICONDUCTOR DEVICE

(75) Inventors: Toru Takayama, Atsugi (JP); Junya Maruyama, Ebina (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/199,084

(22) Filed: Aug. 9, 2005

(65) Prior Publication Data

US 2005/0282357 A1    Dec. 22, 2005

Related U.S. Application Data

(62) Division of application No. 10/215,181, filed on Aug. 9, 2002, now Pat. No. 6,946,361.

(30) Foreign Application Priority Data

Aug. 10, 2001  (JP)  .............................. 2001-244885

(51) Int. Cl.
*H01L 21/30* (2006.01)
(52) U.S. Cl. ............... 438/455; 438/458; 257/E21.568; 257/E21.57
(58) Field of Classification Search ............... 438/455, 438/458; 257/E21.568, E21.57
See application file for complete search history.

(56) References Cited

U.S. PATENT DOCUMENTS 4,722,765 A    2/1988  Ambros et al.

(Continued)

FOREIGN PATENT DOCUMENTS

EP  0 849 788  6/1998

(Continued)

OTHER PUBLICATIONS

T. Takayama et al., *A CPU on a Plastic Film Substrate*, 2004 Symposium on VLSI Technology, Digest of Technical Papers, Jun. 15, 2004, pp. 230-231.

*Primary Examiner*—Hsien-Ming Lee
(74) *Attorney, Agent, or Firm*—Eric J. Robinson; Robinson Intellectual Property Law Office, P.C.

(57) ABSTRACT

The invention aims to provide a peeling method without damaging a peeled off layer and to allow separation of not only a peeled off layer having a small surface area but also the entire surface of a peeled off layer having a large surface area. Further, the invention aims to provide a lightweight semiconductor device by sticking a peeled off layer to a variety of substrates and its manufacturing method. Especially, the invention aims to provide a lightweight semiconductor device by sticking a variety of elements such as TFT to a flexible film and its manufacturing method. Even in the case a first material layer 11 is formed on a substrate and a second material layer 12 is formed adjacently to the foregoing first material layer 11, and further, layered film formation, heating treatment at 500° C. or higher or laser beam radiating treatment is carried out, if the first material layer has a tensile stress before the peeling and the second material layer has a compressive stress, excellent separation can easily be carried out by physical means in the interlayer or interface of the second material layer 12.

34 Claims, 18 Drawing Sheets

U.S. PATENT DOCUMENTS

| | | |
|---|---|---|
| 5,206,749 A | 4/1993 | Zavracky et al. |
| 5,258,325 A | 11/1993 | Spitzer et al. |
| 5,317,236 A | 5/1994 | Zavracky et al. |
| 5,341,015 A | 8/1994 | Kohno |
| 5,376,561 A | 12/1994 | Vu et al. |
| 5,391,257 A | 2/1995 | Sullivan et al. |
| 5,397,713 A | 3/1995 | Hamamoto et al. |
| 5,654,811 A | 8/1997 | Spitzer et al. |
| 5,674,304 A | 10/1997 | Fukada et al. |
| 5,757,456 A | 5/1998 | Yamazaki et al. |
| 5,781,164 A | 7/1998 | Jacobsen et al. |
| 5,807,440 A | 9/1998 | Kubota et al. |
| 5,821,138 A | 10/1998 | Yamazaki et al. |
| 5,834,327 A | 11/1998 | Yamazaki et al. |
| 5,851,862 A | 12/1998 | Ohtani et al. |
| 5,879,741 A | 3/1999 | Itoh |
| 6,033,974 A | 3/2000 | Henley et al. |
| 6,043,800 A | 3/2000 | Spitzer et al. |
| 6,059,913 A | 5/2000 | Asmussen et al. |
| 6,100,166 A | 8/2000 | Sakaguchi et al. |
| 6,118,502 A | 9/2000 | Yamazaki et al. |
| 6,127,199 A | 10/2000 | Inoue et al. |
| 6,221,738 B1 | 4/2001 | Sakaguchi et al. |
| 6,258,666 B1 | 7/2001 | Mizutani et al. |
| 6,261,634 B1 | 7/2001 | Itoh |
| 6,268,695 B1 | 7/2001 | Affinito |
| 6,310,362 B1 | 10/2001 | Takemura |
| 6,320,640 B2 | 11/2001 | Nishi et al. |
| 6,339,010 B2 | 1/2002 | Sameshima |
| 6,340,641 B1 | 1/2002 | Muraguchi et al. |
| 6,362,866 B1 | 3/2002 | Yamazaki et al. |
| 6,372,608 B1 | 4/2002 | Shimoda et al. |
| 6,376,333 B1 | 4/2002 | Yamazaki et al. |
| 6,391,220 B1 | 5/2002 | Zhang et al. |
| 6,420,283 B1 | 7/2002 | Ogawa et al. |
| 6,423,614 B1 | 7/2002 | Doyle |
| 6,429,095 B1 | 8/2002 | Sakaguchi et al. |
| 6,448,152 B1 | 9/2002 | Henley et al. |
| 6,486,041 B2 | 11/2002 | Henley et al. |
| 6,492,026 B1 | 12/2002 | Graff et al. |
| 6,521,511 B1 | 2/2003 | Inoue et al. |
| 6,534,382 B1 | 3/2003 | Sakaguchi et al. |
| 6,544,430 B2 | 4/2003 | McCormack et al. |
| 6,572,780 B2 | 6/2003 | McCormack et al. |
| 6,627,518 B1 | 9/2003 | Inoue et al. |
| 6,632,708 B2 | 10/2003 | Sakama et al. |
| 6,645,830 B2 | 11/2003 | Shimoda et al. |
| 6,664,169 B1 | 12/2003 | Iwasaki et al. |
| 6,682,963 B2 | 1/2004 | Ishikawa |
| 6,682,990 B1 | 1/2004 | Iwane et al. |
| RE38,466 E | 3/2004 | Inoue et al. |
| 6,700,631 B1 | 3/2004 | Inoue et al. |
| 6,737,285 B2 | 5/2004 | Iketani et al. |
| 6,753,212 B2 | 6/2004 | Yamazaki et al. |
| 6,774,010 B2 | 8/2004 | Chu et al. |
| 6,781,152 B2 | 8/2004 | Yamazaki |
| 6,784,113 B2 | 8/2004 | Hembree |
| 6,790,747 B2 | 9/2004 | Henley et al. |
| 6,802,926 B2 | 10/2004 | Mizutani et al. |
| 6,814,832 B2 | 11/2004 | Utsunomiya |
| 6,815,240 B2 | 11/2004 | Hayashi |
| 6,818,530 B2 | 11/2004 | Shimoda et al. |
| 6,875,671 B2 | 4/2005 | Faris |
| 6,878,607 B2 | 4/2005 | Inoue et al. |
| 6,885,389 B2 | 4/2005 | Inoue et al. |
| 6,943,369 B2 | 9/2005 | Hayashi |
| 6,946,361 B2 * | 9/2005 | Takayama et al. ........... 438/455 |
| 6,974,731 B2 | 12/2005 | Yamazaki et al. |
| 7,045,438 B2 | 5/2006 | Yamazaki et al. |
| 7,052,978 B2 | 5/2006 | Shaheen et al. |
| 7,094,665 B2 | 8/2006 | Shimoda et al. |
| 7,119,364 B2 | 10/2006 | Yamazaki |
| 7,122,445 B2 | 10/2006 | Takayama et al. |
| 2001/0004121 A1 | 6/2001 | Sakama et al. |
| 2001/0022362 A1 | 9/2001 | Hayashi |
| 2002/0106522 A1 | 8/2002 | McCormack et al. |
| 2003/0032210 A1 * | 2/2003 | Takayama et al. ............ 438/30 |
| 2003/0040164 A1 | 2/2003 | Inoue et al. |
| 2003/0047280 A1 | 3/2003 | Takayama et al. |
| 2003/0047732 A1 | 3/2003 | Yamazaki et al. |
| 2003/0082889 A1 | 5/2003 | Maruyama et al. |
| 2003/0134488 A1 | 7/2003 | Yamazaki et al. |
| 2003/0162312 A1 | 8/2003 | Takayama et al. |
| 2003/0203547 A1 | 10/2003 | Sakaguchi et al. |
| 2003/0217805 A1 | 11/2003 | Takayama et al. |
| 2004/0129960 A1 | 7/2004 | Maruyama et al. |
| 2004/0132265 A1 | 7/2004 | Maruyama et al. |
| 2004/0232413 A1 | 11/2004 | Yamazaki et al. |
| 2006/0121691 A1 | 6/2006 | Noguchi et al. |
| 2007/0212853 A1 | 9/2007 | Maruyama et al. |

FOREIGN PATENT DOCUMENTS

| | | |
|---|---|---|
| EP | 0 858 110 | 8/1998 |
| EP | 0 924 769 | 6/1999 |
| EP | 1 014 452 | 6/2000 |
| EP | 1 351 308 | 10/2003 |
| JP | 01-184957 | 7/1989 |
| JP | 05-243519 | 9/1993 |
| JP | 05-347186 | 12/1993 |
| JP | 07-142570 | 6/1995 |
| JP | 09-105896 | 4/1997 |
| JP | 10-125929 | 5/1998 |
| JP | 10-125930 | 5/1998 |
| JP | 10-125931 | 5/1998 |
| JP | 11-087799 | 3/1999 |
| JP | 11-135882 | 5/1999 |
| JP | 11-243209 | 9/1999 |
| JP | 2000-040812 | 2/2000 |
| JP | 2001-051296 | 2/2001 |
| JP | 2001-085154 | 3/2001 |
| JP | 2001-125138 | 5/2001 |
| JP | 2001-166301 | 6/2001 |
| JP | 2001-189460 | 7/2001 |
| JP | 2001-267578 | 9/2001 |
| JP | 3238223 | 10/2001 |
| JP | 3238223 | 12/2001 |
| JP | 2002-184959 | 6/2002 |
| JP | 2002-217391 | 8/2002 |
| JP | 2002-328624 | 11/2002 |
| JP | 2003-142666 | 5/2003 |
| WO | WO 99/44242 | 9/1999 |

* cited by examiner

BEFORE PEELING OF SUBSTRATE 10

STEP OF PEELING OF SUBSTRATE 10

STATE AFTER PEELING

BEFORE PEELING OF SUBSTRATE 20

PEELING OF SUBSTRATE 20

STATE AFTER PEELING

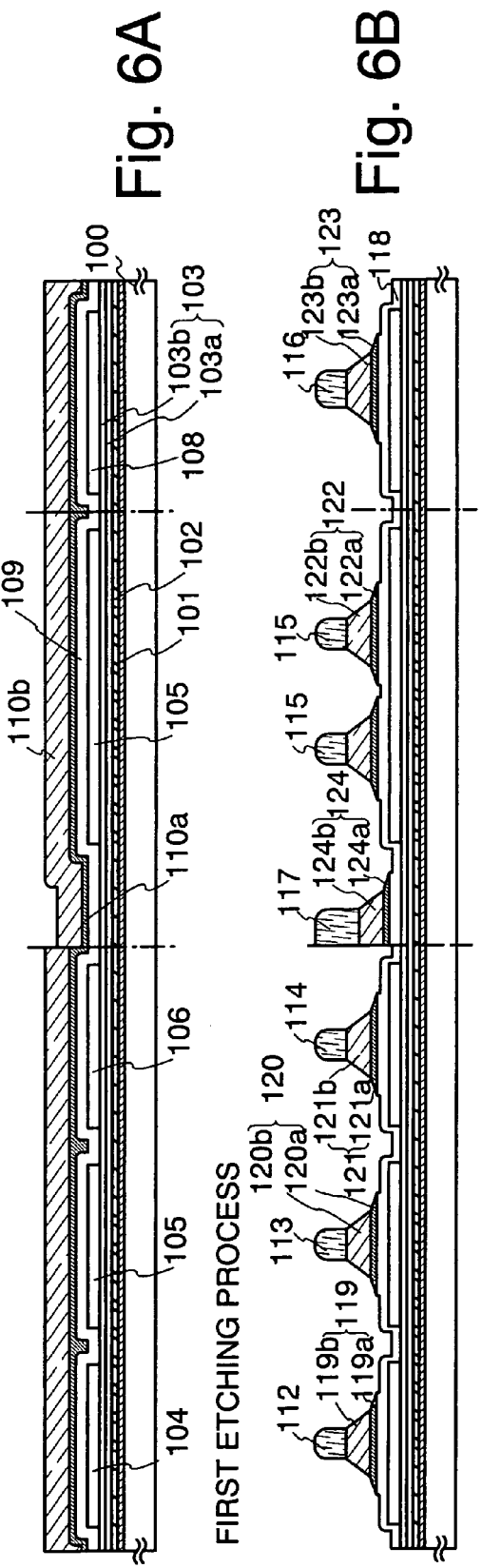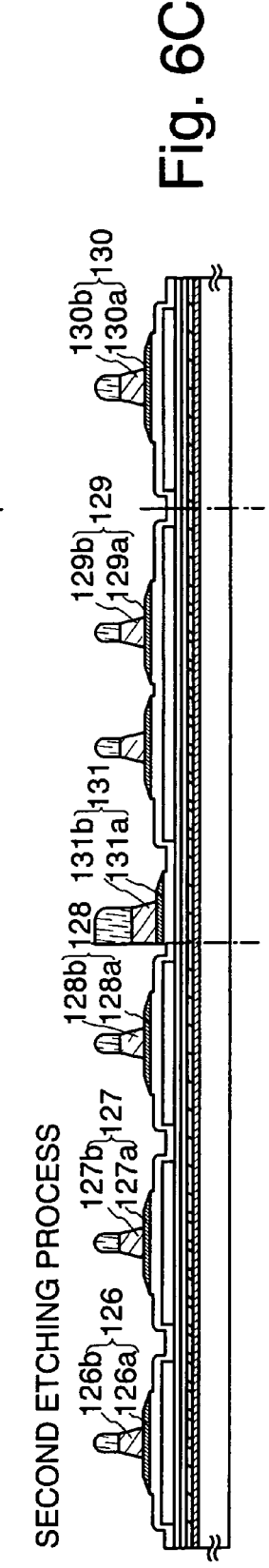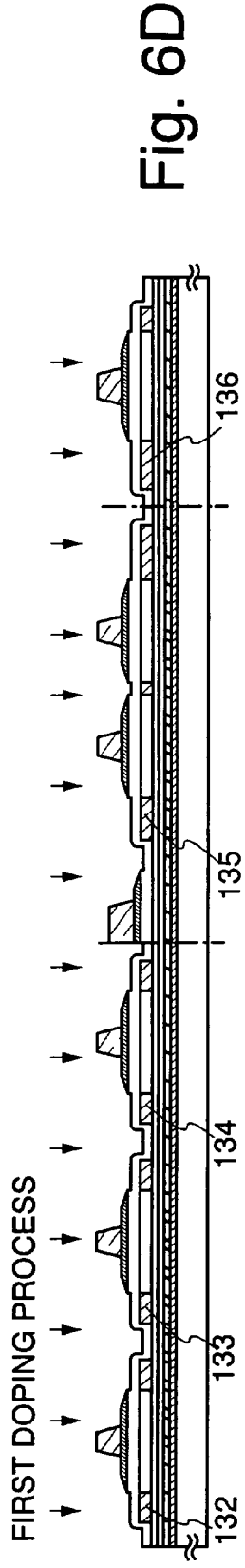

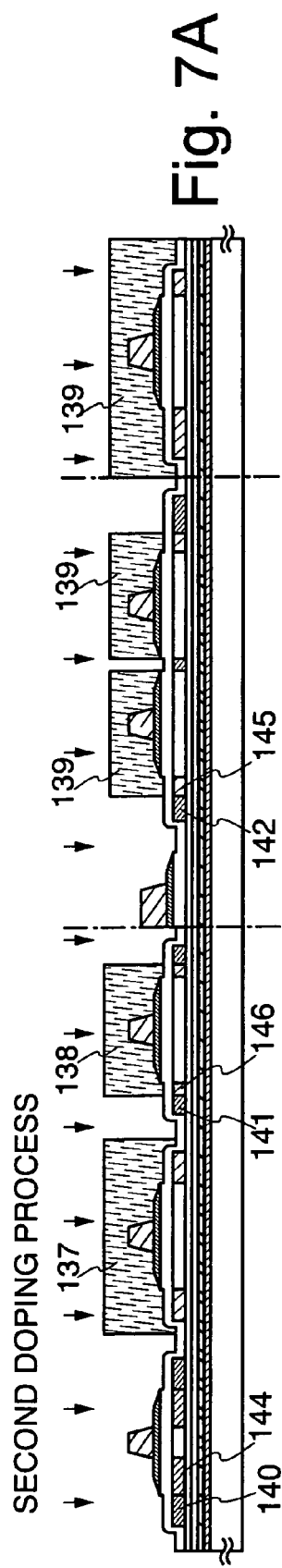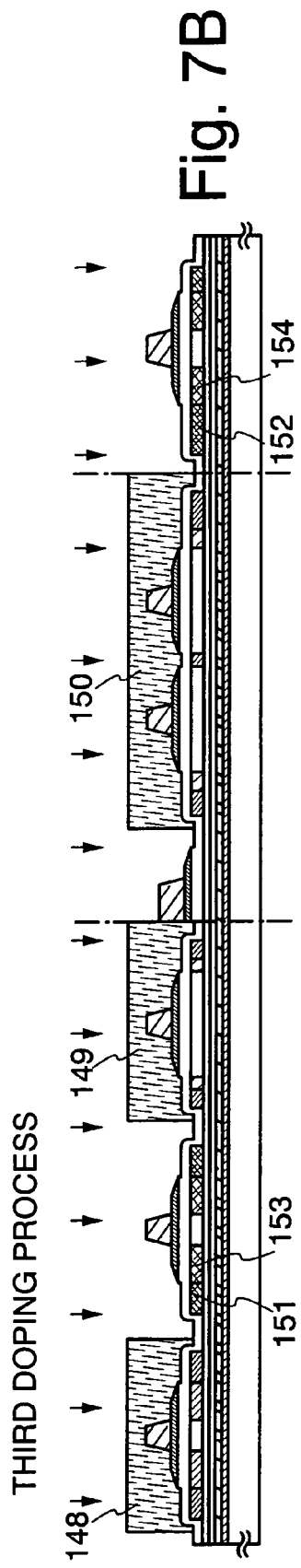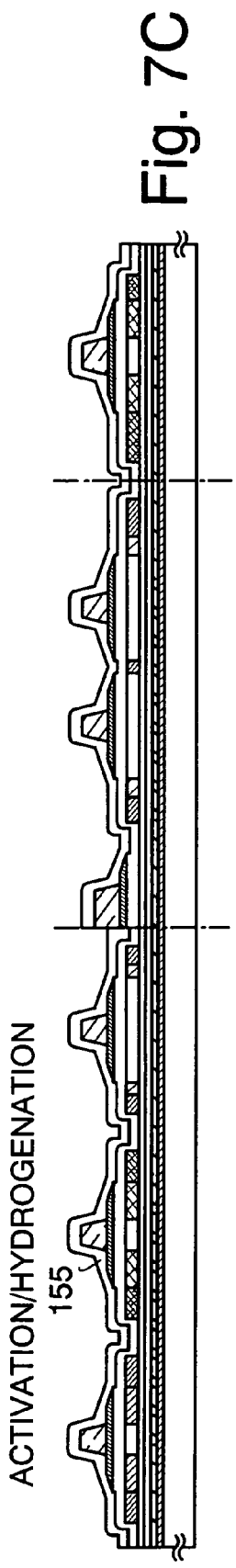

STATE AFTER FORMING OF ACTIVE MATRIX SUBSTRATE

STATE AFTER STICKING SUPPORTING BODY AND INJECTING LIQUID CRYSTAL

STATE AFTER PEELING SUBSTRATE

STATE AFTER STICKING TRANSFER BODY

STATE AFTER FORMING OF ACTIVE MATRIX SUBSTRATE

STATE AFTER PEELING SUBSTRATE

STATE AFTER STICKING TRANSFER BODY

STATE AFTER STICKING SUBSTRATE

STATE AFTER INJECTING LIQUID CRYSTAL

STATE AFTER FORMING ELEMENT

STICKING SUPPORTING BODY

STATE AFTER PEELING SUBSTRATE

STATE AFTER STICKING TRANSFER BODY

METHOD OF PEELING OFF AND METHOD OF MANUFACTURING SEMICONDUCTOR DEVICE

BACKGROUND OF THE INVENTION

1. Field of the Invention

The present invention relates to a peeling method of a peeled off layer, especially, a peeling method of a peeled off layer containing various elements. In addition to that, the present invention relates to a semiconductor device comprising a circuit composed of a thin film transistor (hereinafter referred to as TFT) transferred by sticking a separated peeled off layer to a substrate and its manufacturing method. The invention relates, for example, an electrooptical device such as a liquid crystal module, a light emitting device such as an EL module, and an electronic appliance containing such devices as components therein.

The term semiconductor device, in this specification, covers any device as a whole capable of functioning by utilizing semiconductor characteristics and an electrooptical device, a light emitting device, a semiconductor circuit, and electronic apparatus are all included in the semiconductor device.

2. Related Art

Recently, attention has been paid to a technology of composing a thin film transistor (TFT) using a semiconductor thin film (the thickness of about several to several hundred nm) formed on a substrate having an insulating surface. The thin film transistor is widely applied to electronic devices such as IC and an electrooptical device. Especially, its development as a switching element for an image display apparatus has been urged.

Among a variety of expected applications of such an image display apparatus, above all, utilization for mobile appliances draws attention. Today, although a glass substrate, a quartz substrate and the like are used in many cases, they have disadvantages that they are easy to crack and heavy. Further, in terms of mass production, the glass substrate, the quartz substrate and the like are difficult and unsuitable for enlargement. Therefore, it is tried to use a substrate having flexibility, such as a flexible plastic film to form a TFT element thereon.

However, since the heat resistance of the plastic film is low, the highest temperature for process is required to be low and consequently, it is presently impossible to form any TFT with electric characteristics as excellent as those formed on a glass substrate. Hence, no liquid crystal display apparatus and light emitting element using a plastic film has been actualized.

Further, a peeling method for peeling from the said substrate a peeled off layer existing on a substrate through an isolation layer, has been already proposed. For example, a technique described in Japanese Unexamined Patent Publication No. 10-125929 and Japanese Unexamined Patent Publication No. 10-125931 is a method for separating a substrate by forming an isolation layer of amorphous silicon (or polycrystalline silicon) and releasing hydrogen contained in the amorphous silicon by radiating laser beam through a substrate to form voids for substrate separation. In addition to that, in Japanese Unexamined Patent Publication No. 10-125930, there is a description that using this technique, a liquid crystal display apparatus is completed by sticking a peeled off layer (in the specification, called as a transferred layer) to a plastic layer.

However, by the above-described method, it is essential to use a substrate with high translucency. In order to transmit energy through the substrate and supply energy sufficient to release hydrogen contained in the amorphous silicon, relatively intense laser beam has to be radiated, resulting in a problem that the peeled off layer is damaged. Further, by the above-described method, in the case an element is formed on an isolation layer, if heating treatment at a high temperature is carried out in the element fabrication process, hydrogen contained in the isolation layer is diffused and decreased. As a result, there is a possibility of insufficient peeling-off, even if laser beam is radiated to the isolation layer. Subsequently, attributed to retention of the quantity of hydrogen contained in the isolation layer, there occurs a problem that the process after isolation layer formation may be limited. Also, in the above-described specification, there is a description that in order to prevent damages in the peeled off layer, a light shielding layer or reflecting layer is formed. In such a case, it becomes difficult to fabricate a transmission type liquid crystal display apparatus. Additionally, by the above-described method, peeling of the peeled off layer having a large surface area becomes difficult.

SUMMARY OF THE INVENTION

The invention has been completed in consideration of the above-described problems and the invention aims to provide a peeling method without damaging a peeled off layer and to allow separation of not only a peeled off layer having a small surface area but also the entire surface of a peeled off layer having a large surface area.

Further, the invention aims to provide a peeling method in which the type or the like of a substrate is not limited in formation of a peeled off layer.

Further, the invention aims to provide a lightweight semiconductor device by sticking a peeled off layer to a variety of substrates and its fabrication method. Especially, the invention aims to provide a lightweight semiconductor device by sticking a variety of elements such as TFT [a thin film diode, a photoelectric conversion element (a solar cell, a sensor and the like) comprising PIN junction of silicon, and silicon resistor element] to a flexible film and its fabrication method.

Inventors of the invention have made experiments and investigations repeatedly, and found out the following. That is, when a first material layer is formed on a substrate and a second material layer is formed adjacently to the first material layer and further film formation or heating treatment at 500° C. or higher is carried out on or for the second material layer and then, according to measurement of the internal stress of the respective films, the first material layer has a tensile stress and the second material layer has a compressive stress. The layer structure of the first material layer and the second material layer causes no abnormality such as a film peeling-off (peeling) in the process, whereas the layer structure can be separated well in the interlayer or interface of the second material layer easily by physical means such as application of mechanical force, for example peeling by a man with hands.

That is, the bonding force of the first material layer and the second material layer is strong enough to withstand the heat energy and on the other hand, immediately before the peeling-off, the first material layer having the tensile stress and the second material layer having the compressive stress has the stress strain between them, so that they are weak to mechanical energy and easily separated. Inventors of the invention have found that there is a close relation between the peeling phenomenon and the internal stress of a film. The peeling step for carrying out separation using the internal stress of a film is called a stress peeling-off process.

A constitution 1 of the invention relevant to a peeling method disclosed in this specification is a peeling method for peeling a peeled off layer from a substrate. It is characterized in that the method comprises steps of forming the peeled off layer composed of a first material layer having a tensile stress on the substrate and a second material layer having a compressive stress and neighboring at least the first material layer on the substrate bearing the first material layer thereon and then peeling the peeled off layer from the substrate bearing the first material layer by physical means in the interlayer or interface of the second material layer.

In the above-described constitution 1, the foregoing first material layer is characterized in that the layer has a tensile stress in a range of 1 to $1 \times 10^{10}$ (Dyne/cm$^2$. The foregoing first material layer is not particularly limited if the material has a tensile stress within the foregoing range and a monolayer of any one of a metal material (Ti, Al, Ta, W, Mo, Cu, Cr, Nd, Fe, Ni, Co, Zr, Zn, Ru, Rh, Pd, Os, Ir, Pt and the like), a semiconductor material (e.g. Si, Ge and the like), an insulating material, and an organic material or their laminated layer may be employed. Incidentally, a film having a tensile stress higher than $1 \times 10^{10}$ (Dyne/cm$^2$) is easy to cause peeling in the case of heating treatment.

Further, in the above-described constitution 1, the foregoing second material layer is characterized in that the layer has a compressive stress in a range of $-1$ to $-1 \times 10^{10}$ (Dyne/cm$^2$). The foregoing second material layer is not particularly limited if the material has a compressive stress within the foregoing range and a monolayer of any one of a metal material (Ti, Al, Ta, W, Mo, Cu, Cr, Nd, Fe, Ni, Co, Zr, Zn, Ru, Rh, Pd, Os, Ir, Pt and the like), a semiconductor material (e.g. Si, Ge and the like), an insulating material, and an organic material or their laminated layer may be employed. Incidentally, a film having a compressive stress higher than $-1 \times 10^{10}$ (Dyne/cm$^2$) is easy to cause peeling in the case of heating treatment.

Further, for the first material layer, a material may be used if the material has a tensile stress immediately before the peeling, even if it shows a compressive stress immediately after formation. Constitution 2 of the invention relevant to a peeling method disclosed in this specification, is a peeling method for peeling a peeled off layer from a substrate. It is characterized in that the method comprises steps of forming the peeled off layer composed of a first material layer on the substrate and a second material layer having a compressive stress and neighboring at least the first material layer on the substrate bearing the first material layer thereon and then peeling the peeled off layer from the substrate bearing the first material layer by physical means in the interlayer or interface of the second material layer.

In the above-described constitution 2, the foregoing first material layer is characterized in that the layer has a tensile stress in a range of 1 to $1 \times 10^{10}$ (Dyne/cm$^2$).

In the above-described constitution 2, heating treatment or laser beam radiating treatment is carried out before peeling.

Further, also in the above-described constitution 2, the foregoing second material layer is characterized in that it has a compressive stress in a range of $-1$ to $-1 \times 10^{10}$ (Dyne/cm$^2$).

Further, the peeling may be carried out after a supporting body is stuck with an adhesive. Constitution 3 of the invention relevant to a peeling method disclosed in this specification, is a peeling method for peeling a peeled off layer from a substrate. It is characterized in that the method comprises steps of forming the peeled off layer composed of a first material layer having a tensile stress on the substrate and a second material layer having a compressive stress and neighboring at least the first material layer on the substrate bearing the first material layer thereon, sticking a supporting body to the peeled off layer, and then peeling the peeled off layer stuck to the supporting body from the substrate bearing the first material layer by physical means in the interlayer or interface of the second material layer.

In the case a material having a tensile stress immediately before peeling is used as the first material layer, even if it shows a compressive stress immediately after formation, a constitution 4 of the invention relevant to a peeling method disclosed in this specification, is a peeling method for peeling a peeled off layer from a substrate. It is characterized in that the method comprises steps of forming the peeled off layer composed of a first material layer on the substrate and a second material layer having a compressive stress and neighboring at least the first material layer on the substrate bearing the first material layer thereon, sticking a supporting body to the peeled off layer, and then peeling the peeled off layer from the substrate bearing the first material layer by physical means in the interlayer or interface of the second material layer.

Further in the foregoing constitution 3 and the foregoing constitution 4, in order to promote the peeling before adhesion to the foregoing supporting body, heating treatment or laser beam radiating treatment may be carried out. In such a case, a material absorbing laser beam may be selected for the first material layer and the first material layer may be heated so as to change the internal stress of the film to make peeling easy. Nevertheless, in the case of using laser beam, a translucent substrate is employed.

Further, in the respective constitutions, another layer, for example, an insulating layer, a metal layer and the like, may be formed between the substrate and the first material layer to improve the adhesion strength. However, for simplification of the process, the first material layer is preferable to be formed while being brought into contact with the substrate.

In this specification, the term physical means, denotes means regarded as not chemical but physical means and more particularly, dynamic means comprising a process deduced to dynamics rules or mechanical means and denotes means for converting any dynamics energy (mechanical energy).

Incidentally, both of the above-described constitutions 3 and 4, at the time of peeling by physical means, it is required to make the bonding force of the first material layer and the second material layer lower than that to the supporting body.

Further, in the above-described invention, not only a substrate having translucency but also any kind of substrate, for example, a glass substrate, a quartz substrate, a semiconductor substrate, a ceramic substrate, and a metal substrate, may be used and a peeled off layer formed on a substrate can be peeled off.

Further, employing the above-described peeling method of the invention, it is possible to fabricate a semiconductor device by sticking (transferring) a peeled off layer formed on a substrate to a transfer body and a constitution of the invention relevant to a semiconductor device manufacturing method is a semiconductor device manufacturing method comprising steps of forming a first material layer having tensile stress on a substrate, forming a second material layer having a compressive stress on the first material layer, forming an insulating layer on the second material layer, forming an element on the insulating layer, sticking a supporting body on the element and successively peeling the supporting body off the substrate by physical means in the interlayer or the interface of the second material layer, and sticking a transfer body to the insulating layer or the second material layer and sandwiching the element between the supporting body and the transfer body.

In the case where a material having a tensile stress immediate before peeling is used as the first material layer, even if it has a compressive stress immediately after formation, the constitution of the invention relevant to the semiconductor device manufacturing method disclosed in this specification, is a semiconductor device manufacturing method comprising steps of forming a first material layer on a substrate, forming a second material layer having a compressive stress on said first material layer, forming an insulating layer on said second material layer, forming an element on said insulating layer, sticking a supporting body on said element and successively peeling said supporting body from said substrate by physical means in the interlayer or the interface of said second material layer, and sticking a transfer body to said insulating layer or said second material layer and sandwiching said element between said supporting body and said transfer body.

Further, in order to promote the peeling, a granular oxide may be formed on the first material layer and the second material layer covering the granular oxide may be formed to make peeling easy.

In the above-described constitution, in order to promote the peeling further before adhesion of the foregoing supporting body, heating treatment or laser beam radiating treatment may be carried out. In such a case, a material absorbing laser beam may be selected for the first material layer and the first material layer may be heated so as to change the internal stress of the film to make peeling easy. Nevertheless, in the case of using laser beam, a translucent substrate is employed.

Further, by employing the above-described peeling method of the invention, it is possible that after being peeled, the peeled off layer formed on the substrate is stuck to a first transfer body and a second transfer body to fabricate a semiconductor device.

Further, in the foregoing respective constitutions relevant to the above-described semiconductor device manufacturing method, the foregoing element is a thin film transistor having a semiconductor layer as an active layer and the foregoing step of forming the semiconductor layer is carried out by crystallizing a semiconductor layer having an amorphous structure by heating treatment or laser beam radiating treatment to crystallize and form the semiconductor layer having a crystalline structure.

In this specification, the term transfer body, means a material to be stuck to the peeled off layer after being peeled and it is not particularly limited and may be a substrate of any composition such as plastics, glass, metals, ceramics and the like. Also, in this specification, the term supporting body, means a material to be stuck to the peeled off layer at the time of peeling by physical means. It is not particularly limited and may be a substrate of any composition such as plastics, glass, metals, ceramics and the like. Further, the shape of the transfer body and the shape of the supporting body are not particularly limited and may have a flat, curved, flexible, or film-like shape. If the lightweight property receives the first priority, a preferable one is a film-like plastic substrate such as plastics of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), and the like.

In the above-described respective constitutions relevant to the above-described semiconductor device manufacturing method, in the case of fabricating a liquid crystal display apparatus, a supporting body is used as a counter substrate and a seal material is used as an adhesive to stick the supporting body to a peeled off layer. In such a case, the element formed in the foregoing peeling-off layer has a pixel electrode and a liquid crystal is packed between the pixel electrode and the foregoing counter electrode Further, in the above-described respective constitutions relevant to the above-described semiconductor device manufacturing method, in the case of fabricating a light emitting apparatus such as an EL light emitting device, it is preferable to use a seal material as a supporting body to completely shut the light emitting element out of the outside in a manner that outside substances such as water and oxygen which accelerate deterioration of an organic compound layer are prevented from penetration. If a lightweight property receives the first priority, a film-like plastic substrate is preferable, however it is inferior to prevent substances such as water and oxygen of the outside which accelerate deterioration of an organic compound layer from penetration and therefore, a first insulating film, a second insulating film, and a third insulating film may be formed on a supporting body so as to sufficiently prevent penetration of substances such as water and oxygen of the outside which accelerate deterioration of an organic compound layer from penetration. Nevertheless, the foregoing second insulating film (a stress moderating film) sandwiched between the foregoing first insulating film (a barrier film) and the foregoing third insulating film (a barrier film) is made to have a lower film stress than that of the foregoing first and third insulating films.

In the case of fabricating a light emitting apparatus such as an EL light emitting device, not only for the supporting body but also for transfer body, it is preferable to similarly form a first insulating film, a second insulating film, and a third insulating film to sufficiently prevent penetration of substances such as water and oxygen of the outside which accelerate deterioration of an organic compound layer from penetration.

In this specification, the internal stress of a film means, taking any optional cross-section of the inside of the film formed on a substrate into consideration, the force per unit cross-section surface area therewith one side of the cross-section affects the other side. It can be said that the internal stress is inevitably caused more or less in a thin film formed by vacuum evaporation, sputtering, and vapor phase deposition. The value reaches at the maximum $10^9$ N/m$^2$. The internal stress value changes depending on a material of the thin film, a substance of a substrate, and the formation condition of the thin film. Also, heating treatment changes the internal stress value.

Further, the state that the force affects a counterpart through a unit cross-section surface area perpendicular to a substrate face in the pulling direction is called as the tensile state and the internal stress in such a case is called as tensile stress, whereas the state that the force affects in the pushing direction is called as the compressive state and the internal stress in such a case is called as compressive stress. Incidentally, in this specification, the tensile stress is set to be positive (+) and the compressive stress to be negative (−) in graphs and tables.

(Experiment 1)

Using titanium nitride for a first material layer and silicon oxide for a second material layer, the second material layer is formed while contacting the first material layer. In order to confirm whether a peeled off layer formed on the second material layer could be peeled from a substrate or not, the following experiment is carried out.

At first, a layered structure illustrated in FIG. 3A is formed on a substrate.

As a substrate 30, a glass substrate (#1737) is used. Also, on the substrate 30, an aluminum-silicon alloy layer 31 with a film thickness of 300 nm is formed by a sputtering method. Next, a titanium nitride layer 32 with a film thickness of 100 nm is formed by a sputtering method.

Next, a silicon oxide layer 33 with a film thickness of 200 nm is formed by a sputtering method. The film formation of the silicon oxide layer 33 is carried out under the conditions using an RF type sputtering apparatus and a silicon oxide target (diameter of 30.5 cm) at 150° C. substrate temperature, 0.4 Pa film formation pressure, 3 kW film formation power, and 35 sccm/15 sccm=argon flow rate/oxygen flow rate.

Next, underlying insulating layer is formed on the silicon oxide layer 33 by plasma CVD method. As the underlying insulating layer is formed a silicon nitride oxide film 34a (composition ratio Si=32%, O=27%, N=24%, and H=17%) with a thickness of 50 nm from raw material gases of $SiH_4$, $NH_3$, and $N_2O$ at a film formation temperature of 300° C. by a plasma CVD method. After that, the surface is washed with ozone water and then, an oxide film on the surface is removed by a diluted hydrofluoric acid (1/100 dilution). Next, a silicon nitride oxide film 34b (composition ratio Si=32%, O=59%, N=7%, and H=2%) with a thickness of 100 nm is layered thereon using raw material gases of $SiH_4$ and $N_2O$ at a film formation temperature of 300° C. by a plasma CVD method and further a semiconductor layer (in this case an amorphous silicon layer 35) having an amorphous structure and a thickness of 54 nm is formed using a film formation gas of $SiH_4$ at a film formation temperature of 300° C. by a plasma CVD method without opening to the atmospheric air (FIG. 3A).

Next, a nickel acetate solution containing nickel in 10 ppm on the basis of weight is coated by a spinner. In place of coating, a method for spreading nickel element to the entire surface by sputtering might be employed. Then, heating treatment is carried out for crystallization to form a semiconductor film (in this case, a polysilicon layer 36) having a crystal structure (FIG. 3B). Here, after heating treatment (500° C. for 1 hour) for dehydrogenation, heating treatment for the crystallization (550° C. for 4 hours) is carried out to obtain a silicon film with a crystal structure. Incidentally, in this case, a crystallization technique using nickel as a metal element for promoting crystallization of silicon is employed, other well-known crystallization technique, for example, a solid-phase growth method and a laser crystallization method may be employed.

Next, using epoxy resin for an adhesive layer 37, a film substrate 38 (in this case, polyethylene terephthalate (PET)) is stuck to the polysilicon layer 36 (FIG. 3C).

After the state shown in FIG. 3C is achieved, the film substrate 38 and the substrate 30 are pulsed by man's hands so as to separate them from each other. In the peeled substrate 30, at least titanium nitride and aluminum-silicon alloy layers are found remained. According to this experiment, it is supposed that the peeling took place in the interlayer or the interface of the silicon oxide 33.

As described above, it is made possible to peel the peeled off layer in the entire face from the substrate 30 by forming the second material layer adjacently to the first material layer and peeling the peeled off layer formed on the second material layer.

(Experiment 2)

Here, in the case of using TiN, W, WN, Ta, and TaN as the first material layer, the second material layer (silicon oxide: 200 nm film thickness) is formed while contacting the first material layer and in order to confirm whether a peeled off layer formed on the second material layer could be peeled off a substrate or not, the following experiment is carried out.

As a sample 1, TiN with a film thickness of 100 nm is formed on a glass substrate by a sputtering method and after that, a silicon oxide film with a film thickness of 200 nm is formed. After the formation of the silicon oxide film, layering and crystallization are carried out similarly to the experiment 1.

As a sample 2, after W with a film thickness of 50 nm is formed on a glass substrate by a sputtering method and after that, a silicon oxide film with a film thickness of 200 nm is formed. After the formation of the silicon oxide film, layering and crystallization are carried out similarly to the experiment 1.

As a sample 3, after WN with a film thickness of 50 nm is formed on a glass substrate by a sputtering method and after that, a silicon oxide film with a film thickness of 200 nm is formed. After the formation of the silicon oxide film, layering and crystallization are carried out similarly to the experiment 1.

As a sample 4, after TiN with a film thickness of 50 nm is formed on a glass substrate by a sputtering method and after that, a silicon oxide film with a film thickness of 200 nm is formed. After the formation of the silicon oxide film, layering and crystallization are carried out similarly to the experiment 1.

As a sample 5, after Ta with a film thickness of 50 nm is formed on a glass substrate by a sputtering method and after that, a silicon oxide film with a film thickness of 200 nm is formed. After the formation of the silicon oxide film, layering and crystallization are carried out similarly to the experiment 1.

As a sample 6, after TaN with a film thickness of 50 nm is formed on a glass substrate by a sputtering method and after that, a silicon oxide film with a film thickness of 200 nm is formed. After the formation of the silicon oxide film, layering and crystallization are carried out similarly to the experiment 1.

In the samples 1 to 6 are formed in above-described manner, an adhesive tape is stuck to each peeled off layer to carry out an experiment to confirm whether peeling is possible or not. The results are shown in Table 1.

TABLE 1

| | First material layer (underlayer) | Second material layer (upper layer) | Tape test |
| --- | --- | --- | --- |
| Sample 1 | TiN (100 nm) | Silicon oxide (200 nm) | Peeled |
| Sample 2 | W (50 nm) | Silicon oxide (200 nm) | Peeled |
| Sample 3 | WN (50 nm) | Silicon oxide (200 nm) | Peeled |
| Sample 4 | TiN (50 nm) | Silicon oxide (200 nm) | Not peeled |
| Sample 5 | Ta (50 nm) | Silicon oxide (200 nm) | Not peeled |
| Sample 6 | TaN (50 nm) | Silicon oxide (200 nm) | Not peeled |

Further, regarding each of the silicon oxide film, TiN film, W film, and Ta film, the internal stress is measured before and after heating treatment (550° C., 4 hours). The results are shown in Table 2.

TABLE 2

| | Internal stress value of a film (dyne/cm$^2$) | |
| --- | --- | --- |
| | After film formation | After heating treatment |
| Silicon oxide film | −9.40E + 08 | −1.34E + 09 |
| | −9.47E + 08 | −1.26E + 09 |
| TiN film | 3.90E + 09 | 4.36E + 09 |
| | 3.95E + 09 | 4.50E + 09 |
| W film | −7.53E + 09 | 8.96E + 09 |
| | −7.40E + 09 | 7.95E + 09 |
| Ta film | 9.23E + 09 | −7.84E + 09 |
| | 5.16E + 09 | −1.95E + 10 |

Incidentally, the silicon oxide film formed in a film thickness of 400 nm on a silicon substrate by a sputtering method is subjected for the measurement and regarding the TiN film, W film, and Ta film, after film formation in a film thickness of 400 nm of a glass substrate, the internal stress is measured and then, after a silicon film as a cap film is layered and heating treatment is carried out, the cap film is removed and again the internal stress is measured. Also, each two specimens are produced for every sample to carry out the measurement.

Regarding the W film, although the film had a compressive stress (about −7×10$^9$ (Dyne/cm$^2$)) immediately after the film formation and becomes a film having a tensile stress (about 8×10$^9$ to 9×10$^9$ (Dyne/cm$^2$)) by the heating treatment and the peeling state is excellent. Regarding the TiN film, the stress scarcely changed before and after the heating treatment and the film had a tensile stress (about 3.9×10$^9$ to 4.5×10$^9$ (Dyne/cm$^2$ with little alteration. However, in the case where the film thickness is 50 nm or thinner, peeling is inferior. Regarding the Ta film, although the film had a tensile stress (about 5.1×10$^9$ to 9.2×10$^9$ (Dyne/cm$^2$)) immediately after the film formation and becomes a film having a compressive stress (about −2×10$^9$ to −7.8×10$^9$ (Dyne/cm$^2$)) by the heating treatment and is not peeled by the tape test. Further, regarding the silicon oxide film, the stress scarcely changed before and after the heating treatment and the film had a compressive stress (about −9.4×10$^8$ to −1.3× 10$^9$ (Dyne/cm$^2$)) with little alteration.

From these results, the peeling phenomenon is relevant to the adhesion property depending on various factors and had a close relation especially with the internal stress and in the case of using the second material layer having a compressive stress and the first material layer having a tensile stress after heating treatment, the peeled off layer is found peeled in the entire surface off a substrate. Further, in the case the stress is changed by heating treatment or laser beam radiating treatment, it is preferable to use a material for the first material layer which had a tensile force value increased as compared with that before heating treatment or laser beam radiating treatment.

BRIEF DESCRIPTION OF THE DRAWINGS

FIGS. 6A to 6D are views illustrating the steps of fabrication of an active matrix substrate.
FIGS. 7A to 7C are views illustrating the steps of fabrication of an active matrix substrate.

DESCRIPTION OF THE PREFERRED EMBODIMENT

Figure 1A:
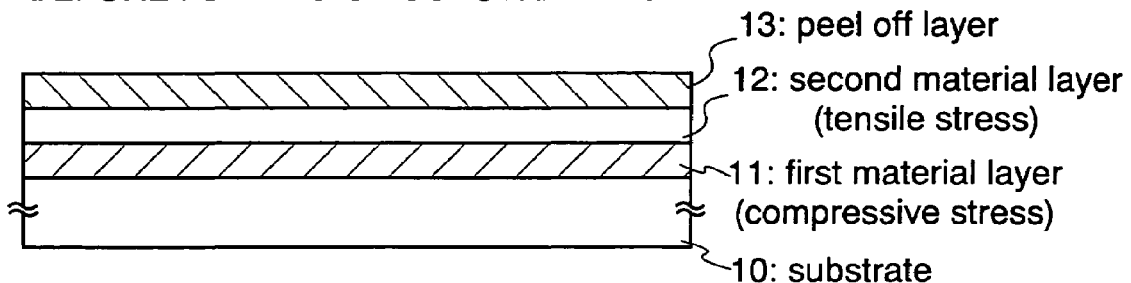
FIGS. 1A to 1C are views illustrating the embodiment 1.

Hereinafter, embodiments of the invention will be described.

Embodiment 1

Hereinafter, typical peeling procedures of the invention will be described concisely with reference to FIG. 1 In FIG. 1A, the reference numeral 10 denotes a substrate, 11 denotes a first material layer having a tensile stress, 12 denotes a material layer having a compressive stress, and 13 denotes a peeled off layer.

In FIG. 1A, the substrate 10 may be a quartz substrate, a ceramic substrate or the like. Further, a silicon substrate, a metal substrate, or a stainless steel substrate may be used.

At first, as illustrated in FIG. 1A, the first material layer 11 is formed on the substrate 10. The first material layer 11 may have a tensile stress even if it has a compressive stress immediately after film formation and it is important for the layer to use a material causing no abnormality such as peeling by heating treatment or laser beam radiating treatment in the peeled off layer formation and having a tensile stress in a range of 1 to 1×10$^{10}$ (Dyne/cm$^2$) after the peeled off layer formation. Typical examples are monolayers of elements selected from W, WN, TiN, TiW as well as alloy materials and compounds containing the foregoing elements as main components and their layered structure.

Next, the second material layer 12 is formed on the first material layer 11. It is important for the second material layer 12 to use a material causing no abnormality such as peeling by heating treatment or laser beam radiating treatment in the peeled off layer formation and having a compressive stress in a range of 1 to 1×10$^{10}$ (Dyne/cm$^2$) after the peeled off layer formation. Typical examples of the second material layer 12 are monolayers of silicon oxide, silicon nitride oxide, and metal oxide materials and their layered structure. The second material layer 12 may be formed by employing any film formation method such as a sputtering method, a plasma CVD method, a coating method and the like.

In this invention, it is important to make the second material layer 12 has a compressive stress and the first material layer 11 has a tensile stress. The film thickness of the respective films may properly be set within a range of 1 nm to 1,000 nm so as to adjust the internal stress in the first material layer 11 and the internal stress in the second material layer 12. Further, heating treatment and laser beam radiating treatment may be carried out so as to adjust the internal stress in the first material layer 11 and the internal stress in the second material layer 12.

Further, in FIG. 1, although, for simplification of the process, an example where the first material layer 11 is formed adjacently to the substrate 10 is illustrated, an insulating layer or a metal layer, which will become a buffer layer, may be formed between the substrate 10 and the first material layer 11 to improve the adhesion property to the substrate 10.

Next, a peeled off layer 13 is formed on the second material layer 12 (FIG. 1A). The peeled off layer 13 may be a layer containing a variety of elements such as TFT (a thin film diode, an photoelectric conversion element having a PIN junction of silicon, and a silicon resistor element). Heating treatment to the extent that the substrate 10 can stand may be carried out. In this invention, even if the internal stress of the second material layer 12 and the internal stress of the first material layer 11 differ from each other, no peeling takes place by the heating treatment in the step of formation of the peeled off layer 13.

Figure 1B:
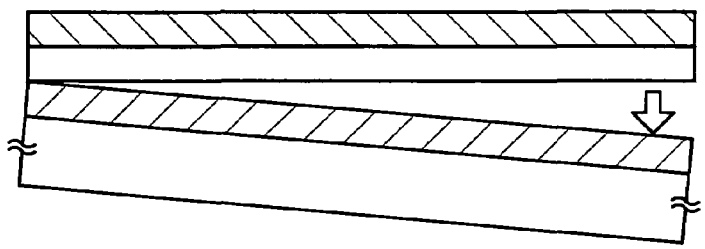

Next, the substrate 10 on which the first material layer 11 is formed is peeled off by physical means (FIG. 1B). Since the second material layer 12 has a tensile stress and the first material layer 11 has a compressive stress, peeling can be carried out with relatively slight force. In this case, the example where the peeled off layer 13 is assumed to have a sufficient mechanical strength is exemplified, however in the case where the mechanical strength of the peeled off layer 13 is insufficient, it is preferable to carry out peeling after a supporting body (not illustrated) for fixing the peeled off layer 13 is stuck.

Figure 1C:
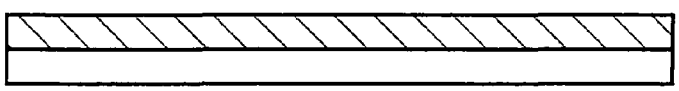

In such a manner, the peeled off layer 13 formed on the second material layer 12 can be separated from the substrate 10. The state after peeling is shown in FIG. 1C.

Further, after peeling, the peeled object, the peeled off layer 13, may be stuck to a transfer body (not illustrated).

The invention can be applied to manufacturing methods of a variety of semiconductor devices. Especially, using plastic substrates for the transfer body and the supporting body, weight is made light.

In the case of fabricating a liquid crystal display apparatus, the supporting body is used as a counter substrate and a seal material as an adhesive to stick the supporting body to the peeled off layer. In this case, the element formed in the peeled off layer has a pixel electrode and a liquid crystal material is packed between the pixel electrode and the foregoing counter electrode. Further, the procedure of the fabrication of the liquid crystal display apparatus is not particularly limited and may be carried out in a manner that after the counter substrate as the supporting body is stuck and a liquid crystal is injected, the substrate is peeled off and a plastic substrate as the transfer body is stuck or after the pixel electrode is formed, the substrate is peeled and then the plastic substrate as a first transfer body is stuck and successively a counter substrate as a second transfer body is stuck.

In the case of fabricating a light emitting apparatus such as an EL light emitting device, it is preferable to use a seal material for a supporting body to completely shut the light emitting element out of the outside in a manner that outside substances such as water and oxygen which accelerate deterioration of an organic compound layer are prevented from penetration. Further, in the case of fabricating a light emitting apparatus such as an EL light emitting device, it is preferable not only for the supporting body but also for the transfer body, to prevent sufficiently outside substances such as water and oxygen which accelerate deterioration of an organic compound layer from penetration. The procedure of fabrication of the light emitting apparatus is not particularly limited, and may be carried out in a manner that after a light emitting element is formed, a plastic substrate as the supporting body is stuck and the substrate is peeled off. And then, a plastic substrate as the transfer body is stuck or after the light emitting element is formed, the substrate is peeled and then the plastic substrate as a first transfer body is stuck and successively a counter substrate as a second transfer body is stuck.

Embodiment 2

In this embodiment, the peeling procedure for peeling a substrate while preventing diffusion of impurities from a first material layer and the substrate after an underlying insulating layer is formed adjacently to a peeled off layer will concisely be described with reference to FIG. 2.

Figure 2A:
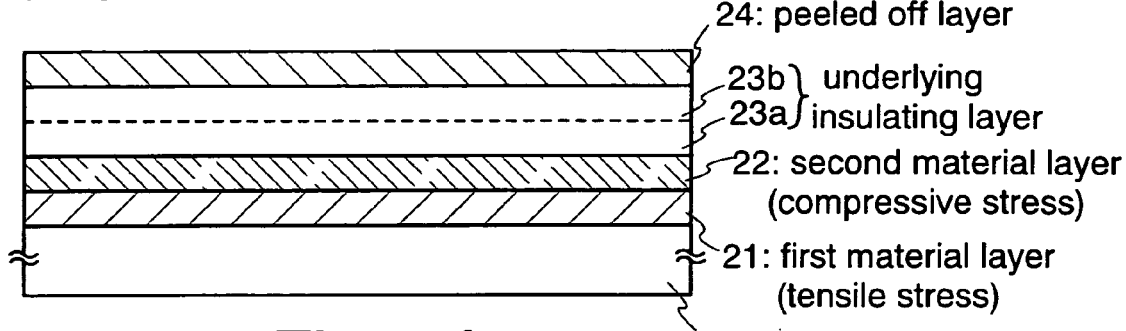
FIGS. 2A to 2C are views illustrating the embodiment 2.

In FIG. 2A, the reference numeral 20 denotes a substrate, 21 denotes a first material layer having a tensile stress, 22 denotes a second material layer having a compressive stress, 23a and 23b each denote an underlying insulating layer, and 24 denotes a peeled off layer.

In FIG. 2A, the substrate 20 may be a glass substrate, a quartz substrate, a ceramic substrate or the like. Further, a silicon substrate, a metal substrate, or a stainless steel substrate may be used.

At first, as illustrated in FIG. 2A, the first material layer 21 is formed on the substrate 20. The first material layer 21 may have a compressive stress or a tensile stress immediately after film formation and it is important for the layer to use a material causing no abnormality such as peeling by heating treatment or laser beam radiating treatment in the peeled off layer formation and having a tensile stress in a range of 1 to $1 \times 10^{10}$ (Dyne/cm$^2$) after the peeled off layer formation. Typical examples are monolayers of elements selected from W, WN, TiN, TiW as well as alloy materials and compounds containing the foregoing elements as main components and their layered structure.

Next, the second material layer 22 is formed on the first material layer 21. It is important for the second material layer 22 to use a material causing no abnormality such as peeling by heating treatment or laser beam radiating treatment in the peeled off layer formation and having a compressive stress in a range of 1 to $1 \times 10^{10}$ (Dyne/cm$^2$) after the peeled off layer formation. Typical examples of the second material layer 22 are silicon oxide, silicon nitride oxide, and metal oxide materials and their layered structure. The second material layer 22 may be formed by employing any film formation method such as a sputtering method, a plasma CVD method, a coating method and the like.

In this invention, it is important to make the second material layer 22 have a compressive stress and the first material layer 21 have a tensile stress. The film thickness of the respective films may properly be set within a range of 1 nm to 1,000 nm so as to adjust the internal stress in the first material layer 21 and the internal stress in the second material layer 22. Further, heating treatment and laser beam radiating treatment may be carried out so as to adjust the internal stress in the first material layer 21 and the internal stress in the second material layer 22.

Further, in FIG. 2, although, for simplification of the process, an example where the first material layer 21 is formed adjacently to the substrate 20 is illustrated, an insulating layer or a metal layer, which will become a buffer layer, may be formed between the substrate 20 and the first material layer 21 to improve the adhesion property to the substrate 20.

Then, underlying insulating layers 23a and 23b are formed on the second material layer 22. In this case, a silicon nitride oxide film 23a (composition ratio Si=32%, O=27%, N=24%, and H=17%) with a thickness of 50 nm (preferably 10 to 200 nm) is formed using raw material gases of $SiH_4$, $NH_3$, and $N_2O$ at a film formation temperature of 400° C. by a plasma CVD method and further a silicon nitride oxide film 23b (composition ratio Si=32%, O=59%, N=7%, and H=2%) with a thickness of 100 nm (preferably 50 to 200 nm) is layered thereon using raw material gases of $SiH_4$ and $N_2O$ at a film formation temperature of 400° C. by a plasma CVD method, however the layers are not limited to that and may have a monolayer structure or a layered structure of 3 or more layers.

Next, a peeled off layer 24 is formed on the underlying insulating layer 23b (FIG. 2A).

In the case of such a two-layered structure of the underlying insulating layers 23a, 23b, in the process of formation of the peeled off layer 24, diffusion of impurities from the first material layer 21, the second material layer 22, and the substrate 20 can be prevented. Further, owing to the underlying insulating layers 23a, 23b, the adhesion property between the second material layer 22 and the peeled off layer 24 can be improved.

Further in the case the surface of the first material layer 21 or the second material layer 22 is roughened, the surface may be leveled before or after the formation of the underlying insulating layers. The coverage of the peeled off layer 24 becomes high by leveling, and therefore it is preferable since the element characteristics are stabilized easily in the case where the peeled off layer 24 containing an element is formed. Incidentally, as the leveling treatment, an etching back method for leveling by forming a coating film (a resist film or the like) and then carrying out etching, a mechanochemical polishing method (CMP method), and the like may be employed.

Figure 2B:
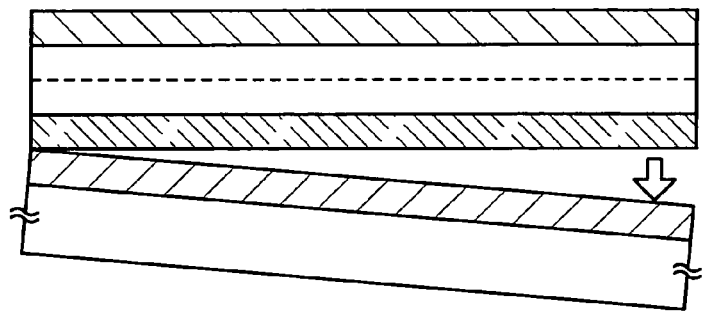

Then, the substrate 20 bearing the first material layer 21 thereon is peeled off by physical means (FIG. 2B). Since the second material layer 22 has a compressive stress and the first material layer 21 has a tensile stress, peeling can be carried out with a relatively slight force. Further, in this case, the example where the peeled off layer 24 is assumed to have a sufficient mechanical strength is exemplified, however in the case the mechanical strength of the peeled off layer 24 is insufficient, it is preferable to carry out peeling after a supporting body (not illustrated) for fixing the peeled off layer 24 is stuck.

Figure 2C:
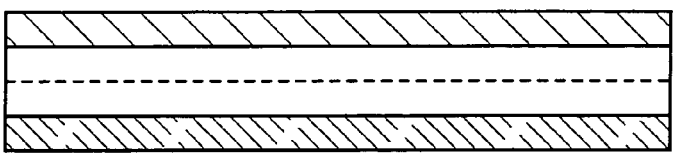

In such a manner, the peeled off layer 24 formed on the underlying insulating layer 22 can be separated from the substrate 20. The state after peeling is shown in FIG. 2C.

Further, after peeling, the peeled off layer 24 may be stuck to a transfer body (not illustrated).

The invention can be applied to manufacturing methods of a variety of semiconductor devices. Especially, using plastic substrates for the transfer body and the supporting body, weight is made light.

In the case of fabricating a liquid crystal display apparatus, the supporting body is used as a counter substrate and a seal material as an adhesive to stick the supporting body to the peeled off layer. In this case, the element formed in the peeled off layer has a pixel electrode and a liquid crystal material is packed between the pixel electrode and the foregoing counter electrode. Further, the procedure of the fabrication of the liquid crystal display apparatus is not particularly limited and may be carried out in a manner that after the counter substrate as the supporting body is stuck and a liquid crystal is injected, the substrate is peeled off and a plastic substrate as the transfer body is stuck or after the pixel electrode is formed, the substrate is peeled and then the plastic substrate as a first transfer body is stuck and successively a counter substrate as a second transfer body is stuck.

In the case of fabricating a light emitting apparatus such as an EL light emitting device, it is preferable to use a supporting body as a seal material to completely shut the light emitting element out of the outside so as to prevent outside substances such as water and oxygen which accelerate deterioration of an organic compound layer from penetration. Further, in the case of fabricating a light emitting apparatus such as an EL light emitting device, it is preferable not only for the supporting body but also the transfer body to sufficiently prevent outside substances such as water and oxygen which accelerate deterioration of an organic compound layer from penetration. The procedure of fabrication of the light emitting apparatus is not particularly limited and may be carried out in a manner that after a light emitting element is formed, a plastic substrate as the supporting body is stuck and the substrate is peeled off and a plastic substrate as the transfer body is stuck or after the light emitting element is formed, the substrate is peeled and then the plastic substrate as a first transfer body is stuck and successively a plastic substrate as a second transfer body is stuck.

Embodiment 3

In this embodiment, in addition to the embodiment 1, an example where laser beam radiating or heating treatment is carried out in order to promote peeling will be described with reference to FIG. 4.

Figure 4A:
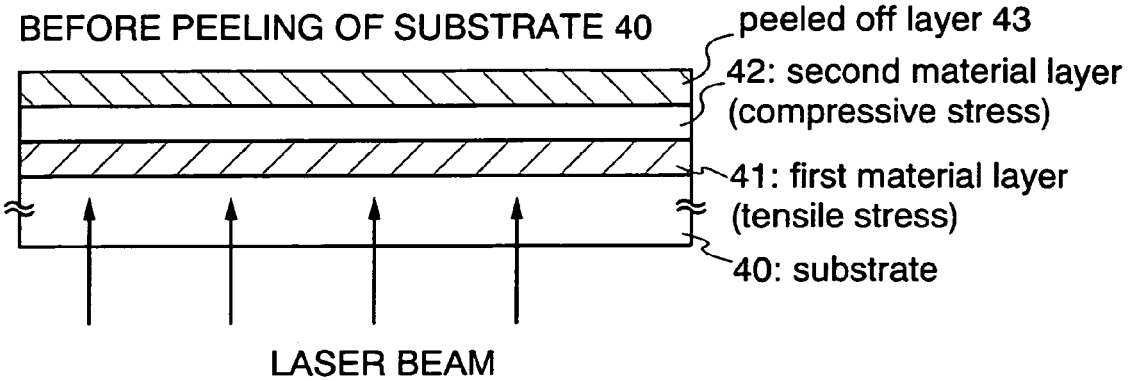
FIGS. 4A to 4C are views illustrating the embodiment 3.

In FIG. 4A, the reference numeral 40 denotes a substrate, 41 denotes a first material layer, 42 denotes a second material layer, and 43 denotes a peeled off layer.

Since the process to form up to the peeled off layer 43 is same as that in the embodiment 1, the description will be omitted.

Figure 3A:
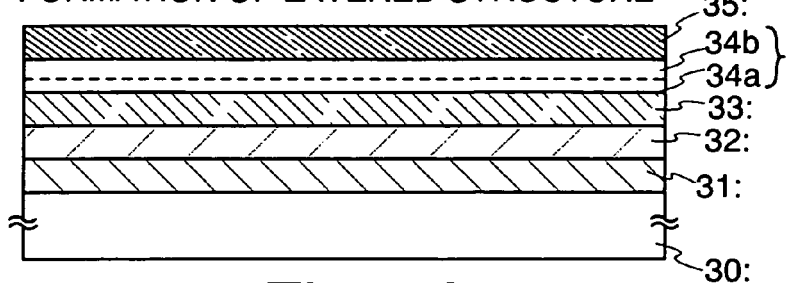
FIGS. 3A to 3D are views illustrating an experiment.
Figure 3B:
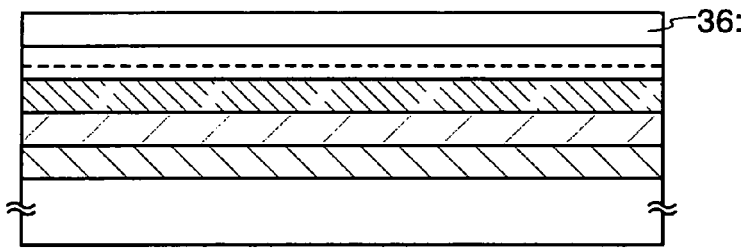
Figure 3C:
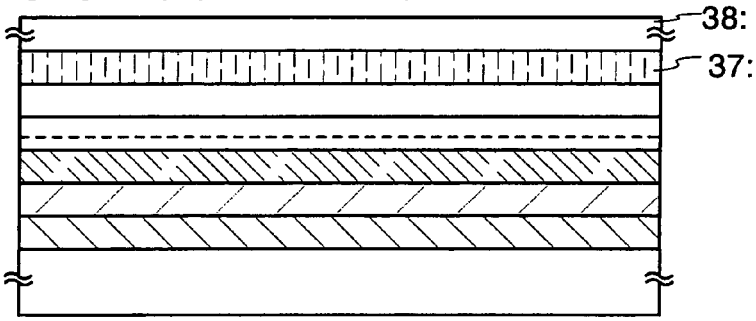
Figure 3D:
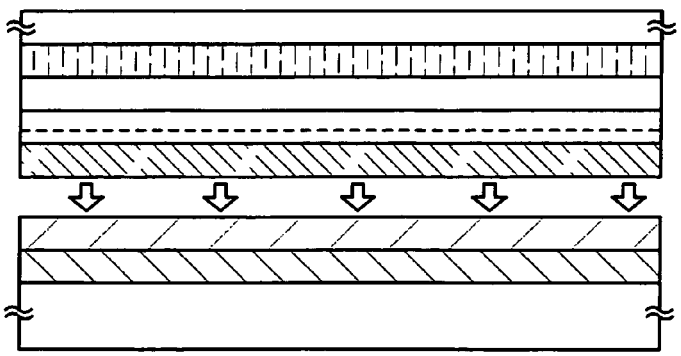

After the peeled off layer 43 is formed, laser beam radiation is carried out (FIG. 3A). Laser beam to be employed includes gas laser such as excimer laser, solid laser of $YVO_4$ laser, YAG laser, and semiconductor laser. The state of laser oscillation may be both continuous oscillation and pulsed oscillation and the shape of the laser beam is also optionally linear, rectangular, circular, or elliptical. The wavelength to be employed may be fundamental, second higher harmonics, or third higher harmonics. Further, the scanning method may be carried out in the vertical direction, the transverse direction, or diagonal direction and further reciprocated.

As for the material as the first material layer 41, preferably a material capable of easily absorbing laser beam and a metal material is used, and a metal nitride material such as titanium nitride is preferable. Incidentally, in order to transmit laser beam, a substrate having translucency is employed for the substrate 40.

Figure 4B:
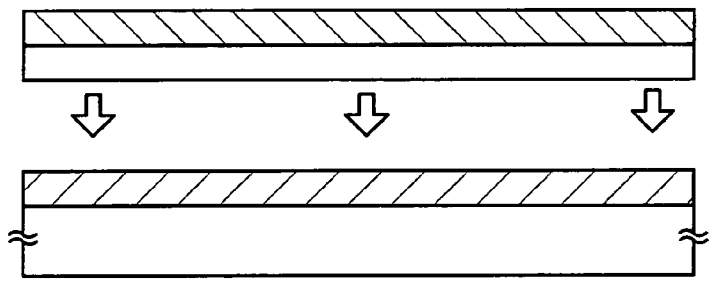

Next, the substrate 40 bearing the first material layer 41 thereon is peeled off by physical means (FIG. 4B). Since the second material layer 42 has a compressive stress and the first material layer 41 has a tensile stress, peeling can be carried out with a relatively slight force.

Laser beam radiation heats the first material layer 41 and the second material layer 42 to change the internal stress of both layers and promote the peeling to make the peeling easy with slight force. Further, in this case, an example where the peeled off layer 43 is assumed to have a sufficient mechanical strength is exemplified, however in the case the mechanical strength of the peeled off layer 43 is insufficient, it is preferable to carry out peeling after a supporting body (not illustrated) for fixing the peeled off layer 43 is stuck.

Figure 4C:

In such a manner, the peeled off layer 43 formed on the second material layer 42 can be separated from the substrate 40. The state after the peeling is illustrated in FIG. 4C.

Further, not being limited to laser beam, visible light rays, infrared rays, ultraviolet rays, microwave from halogen lamps or the like can be employed.

Further, in place of the laser beam, heating treatment in an electric furnace may be employed.

Further, before the adhesion of the supporting body or before the foregoing peeling by the physical means, heating treatment or laser beam radiating treatment may be carried out.

This embodiment may be combined with the embodiment 2.

Embodiment 4

In this embodiment, in addition to the embodiment 1, an example where a granular oxide is formed in the interface between a first material layer and a second material layer in order to promote peeling will be described with reference to FIG. 5.

Figure 5A:
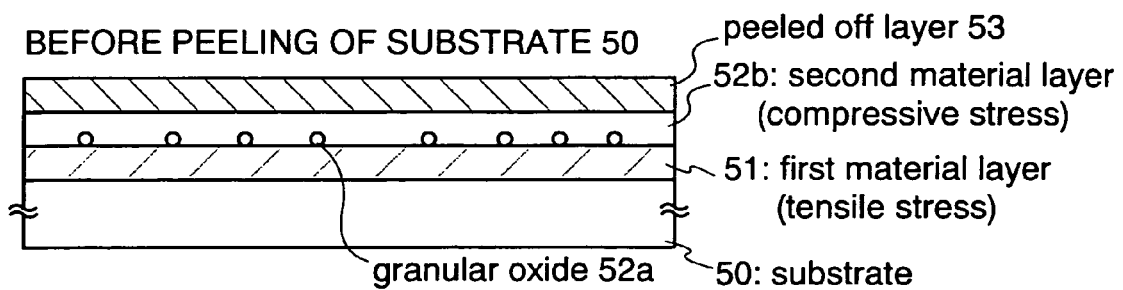
FIGS. 5A to 5C are views illustrating the embodiment 4.

In FIG. 5A, the reference numeral 50 denotes a substrate, 51 denotes a first material layer, 52a denotes the granular oxide, 52b denotes a second material layer, and 53 denotes a peeled off layer.

Since the process to form up to the first material layer 51 is same as that in the embodiment 1, the description will be omitted.

After the first material layer 51 is formed, the granular oxide 52a is formed. As the granular oxide 52a, a metal oxide material such as ITO (indium oxide-tin oxide alloy), an indium oxide-zinc oxide alloy ($In_2O_3$—ZnO), zinc oxide (ZnO) and the like may be used.

Next, while covering the granular oxide 52a, the second material layer 52b is formed. As the second material layer 52b, for example, silicon oxide, silicon nitride oxide, and metal oxide materials may be used. Incidentally, the second material layer 52b may be formed by a film formation method such as a sputtering method, a plasma CVD method, a coating method, and the like.

Next, the peeled off layer 53 is formed on the second material layer 52b (FIG. 5A).

Figure 5B:
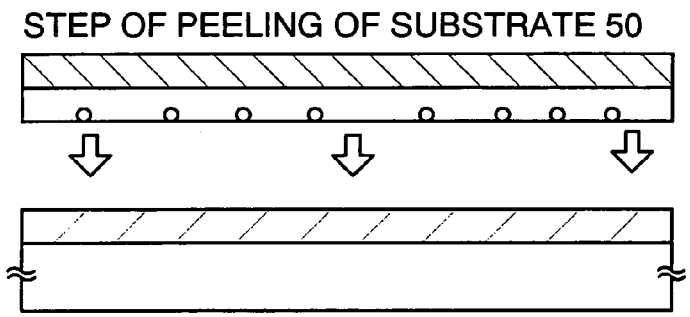

Next, the substrate 50 bearing the first material layer 51 thereon is peeled off by physical means (FIG. 5B). Since the second material layer 52b has a compressive stress and the first material layer 51 has a tensile stress, peeling can be carried out with relatively slight force.

Formation of the granular oxide 52a weakens the bonding force of the first material layer 51 and the second material layer 52 and changes the mutual adhesion property to promote the peeling and make the peeling possible with slight force. Further, in this case, the example where the peeled off layer 53 is assumed to have a sufficient mechanical strength is exemplified, however in the case the mechanical strength of the peeled off layer 53 is insufficient, it is preferable to carry out peeling after a supporting body (not illustrated) for fixing the peeled off layer 53 is stuck.

Figure 5C:
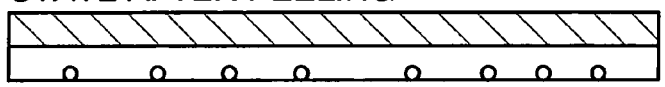

In such a manner, the peeled off layer 53 formed on the second material layer 52b can be separated from the substrate 50. The state after peeling is shown in FIG. 5C.

This embodiment may be combined with the embodiment 2 or the embodiment 3.

The present invention with the above-described constitutions will be described further in details along with examples as follows.

EXAMPLES

Example 1

Examples of the invention will be described with reference to FIG. 6 to FIG. 8. Here, a method for simultaneously fabricating pixel portion and TFT (n-channel type TFT and p-channel type TFT) of driving circuits formed in the vicinity of the pixel portion on a single substrate will be described in details.

At first, on a substrate 100 a first material layer 101, a second material layer 102, and an underlying insulating layer 103 are formed to obtain a semiconductor film having a crystalline structure and then subjected to etching treatment in a desired shape to form semiconductor layers 104 to 108 separated like islands.

A glass substrate (#1737) is used as the substrate 100.

Further, as the first material layer 101, any material can be employed without particular restrictions if it has a tensile stress in a range of 1 to $1\times10^{10}$ (Dyne/cm$^2$) immediately before the peeling step to be carried out later and a monolayer of any one of a metal material (Ti, Al, Ta, W, Mo, Cu, Cr, Nd, Fe, Ni, Co, Zr, Zn, Ru, Rh, Pd, Os, Ir, Pt and the like), a semiconductor material (e.g. Si, Ge and the like), an insulating material, and an organic material or their laminated layer may be employed. In this case, a titanium nitride film with a film thickness of 100 nm by a sputtering method is used.

Further, as the second material layer 102, any material can be employed without particular restrictions if it has a compressive stress in a range of −1 to $-1\times10^{10}$ (Dyne/cm$^2$) immediately before the peeling step to be carried out later and a monolayer of any one of a metal material (Ti, Al, Ta, W, Mo, Cu, Cr, Nd, Fe, Ni, Co, Zr, Zn, Ru, Rh, Pd, Os, Ir, Pt and the like), a semiconductor material (e.g. Si, Ge and the like), an insulating material, and an organic material or their laminated layer may be employed. A monolayer or a laminated layer of a silicon oxide material or a metal oxide material may be employed. The bonding force between the first material layer 101 and the second material layer 102 is durable to heating treatment and it does not cause film peeling (referred also as to peeling). However, it is easy to carry out peeling in the interlayer or interface of the second material layer by physical means.

And, As the underlying insulating film 103, a silicon oxynitride film 103a formed from $SiH_4$, $NH_3$, and $N_2O$ as material gases (composition ratio: Si=32%, O=27%, N=24%, H=17%) is formed with a thickness of 50 nm (preferably 10 to 200 nm) and at a film formation temperature of 400° C. by using plasma CVD. Then, after the surface is cleaned with ozone water, an oxide film on the surface is removed by means of dilute hydrofluoric acid (dilution with 1/100). Next, a silicon oxynitride film 103b formed from $SiH_4$ and $N_2O$ as material gases (composition ratio: Si=32%, O=59%, N=7%, H=2%) is formed thereon with a thickness of 100 nm (preferably 50 to 200 nm) and at a film formation temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 2.5 to 80 nm) with $SiH_4$ as a film formation gas and at a film formation temperature of 300° C. by using plasma CVD.

In this example, the underlying insulting film 103 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_xGe_{1-x}$ (X=0.0001 to 0.02)) alloy by using a known means (sputtering, LPCVD, plasma CVD, or the like). Further, a plasma CVD apparatus may be a single wafer type one or a batch type one. In addition, the underlying insulating film and the semiconductor film may be continuously formed in the same film formation chamber without exposure to an atmosphere.

And, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2 \times 10^{12}/cm^2$.

Then, a nickel acetate salt solution containing nickel of 10 ppm in weight is applied using a spinner. Instead of the application, a method of spraying nickel elements to the entire surface by sputtering may also be used.

Then, a heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (at 550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of a first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or the second harmonic wave or the third harmonic wave of a YAG laser is used for the laser light. In any case, pulse laser light with a repetition frequency of approximately 10 to 1000 Hz is used, the pulse laser light is condensed to 100 to 500 mJ/cm² by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 mJ/cm². Note that an oxide film is formed on the surface by the first laser light irradiation since the irradiation is conducted in the atmosphere or in an oxygen atmosphere.

Next, after the oxide film formed by the first light irradiation is removed by dilute hydrofluoric acid, a second laser light irradiation is performed in a nitrogen atmosphere or in a vacuum, thereby leveling the semiconductor film surface. Excimer laser light with a wavelength of 400 nm or less, or the second harmonic wave or the third harmonic wave of a YAG laser is used as the laser light (the second laser light). The energy density of the second laser light is made larger than that of the first laser light, preferably made larger by 30 to 60 mJ/cm². Here, the second laser light irradiation is performed with a repetition frequency of 30 Hz and energy density of 453 mJ/cm² to thereby set a P-V value (Peak to Valley, means the difference between the maximum value and minimum value) of unevenness in the semiconductor film surface to 50 nm or less. The P-V value can be obtained from AFM (Atomic Force Microscope).

Further, although the second laser light irradiation is conducted over the surface in this example, a step of selectively performing irradiation at least on a pixel portion may be adopted since the reduction of an off current particularly has an effect on a TFT of the pixel portion.

Next, the surface is processed with ozone water for 120 seconds, thereby forming a barrier layer comprised of an oxide film with a thickness of 1 to 5 nm in total.

Then, an amorphous silicon film containing an argon element, which becomes a gettering site, is formed on the barrier layer to have a thickness of 150 nm by sputtering. The film formation conditions with sputtering in this example are: a film formation pressure of 0.3 Pa; a gas (Ar) flow rate of 50 sccm; a film formation power of 3 kW; and a substrate temperature of 150° C. Note that under the above conditions, the atomic concentration of the argon element contained in the amorphous silicon film is $3 \times 10^{20}/cm^3$ to $6 \times 10^{20}/cm^3$, and the atomic concentration of oxygen is $1 \times 10^{19}/cm^3$ to $3 \times 10^{19}/cm^3$. Thereafter, heat treatment at 650° C. for 3 minutes is conducted using the lamp annealing apparatus to perform gettering.

Next, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 104 to 108 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 109, is formed. In this example, a silicon oxynitride film (composition ratio: Si=32%, O=59%, N=7%, H=2%) is formed with a thickness of 115 nm by plasma CVD.

Next, as shown in FIG. 6A, on the gate insulating film 109, the first conductive film 110a with a thickness of 20 to 100 nm and the second conductive film 110b with a thickness of 100 to 400 nm are formed in lamination. In this example, a 50 nm thick tantalum nitride film and a 370 nm thick tungsten film are sequentially laminated on the gate insulating film 109.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, as shown in FIG. 6B, masks 112 to 117 are formed by an exposure step, and the first etching process for forming gate electrodes and wirings is performed. The first etching process is performed with the first and the second etching conditions. An ICP (inductively coupled plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to has a desired taper shape. Note that chlorine-based gases typified by $Cl_2$, $BCl_3$, $SiCl_4$, and $CCl_4$, fluorine-based gases typified by $CF_4$, $SF_6$, and $NF_3$, and $O_2$ can be appropriately used as etching gases.

In this example, RF (13.56 MHz) power of 150 W is applied also to the substrate (sample stage) to substantially apply a negative self-bias voltage. Note that the size of electrode of the substrate is 12.5 cm×12.5 cm, while the size of coil type of electrode (a quartz disk provided by coil here) is 25 cm in the diameter. With the first etching conditions, a W film is etched to form an end portion of the first conductive layer into a tapered shape. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the masks 110 to 115 made of resist. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each has a tapered shape due to the effect of the bias voltage applied to the substrate side. The angle of the tapered portion is sufficiently set to 15 to 45°.

Thus, the first shape conductive layers 119 to 124 composed of the first conductive layer and the second conductive layer (the first conductive layers 119a to 124a and the second conductive layers 119b to 124b) are formed by the first etching process. The insulating film 109 that becomes the gate insulating film is etched by approximately 10 to 20 nm, and becomes a gate insulating film 118 in which regions which are not covered by the first shape conductive layers 119 to 124 are thinned.

Next, the second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 118 is 33.7 nm/min, and a selection ratio of W to SiON is 6.83. In the case where $SF_6$ is used as the etching gas, the selection ratio with respect to the insulating film 118 is high as described above. Thus, reduction in the film thickness can be suppressed. In this example, the film thickness of the insulating film 118 is reduced by only about 8 nm.

By the second etching process, the taper angle of W becomes 70°. By the second etching process, the second conductive layers 126b to 131b are formed. On the other hand, the first conductive layers are hardly etched to become the first conductive layers 126a to 131a. Note that the first conductive layers 126a to 131a have substantially the same size as the first conductive layers 119a to 124a. In actuality, the width of the first conductive layer may be reduced by approximately 0.3 μm, namely, approximately 0.6 μm in the total line width in comparison with before the second etching process. However, there is almost no change in size of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 sccm, RF (13.56MHz) power of 20 W is also applied to the substrate side (sample stage); and RF (13.56MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, the first doping process is conducted to obtain the state of FIG. 6D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, the first conductive layers and the second conductive layers 126 to 130 become masks against the impurity element imparting n-type conductivity, and the first impurity regions 132 to 136 are formed in a self-aligning manner. The impurity element imparting n-type conductivity is added to the first impurity regions 132 to 136 in a concentration range of $1 \times 10^{16}$ to $1 \times 10^{17}$/cm$^3$. Here, the region having the same concentration range as the first impurity region is also called an n$^{--}$ region.

Note that although the first doping process is performed after the removal of the masks made of resist in this example, the first doping process may be performed without removing the masks made of resist.

Next, as shown in FIG. 7A, masks 137 to 139 made of resist are formed, and the second doping process is conducted. The mask 137 is a mask for protecting a channel forming region and a periphery thereof of a semiconductor layer forming a p-channel TFT of a driver circuit, the mask 138 is a mask for protecting a channel forming region and a periphery thereof of a semiconductor layer forming one of n-channel TFTs of the driver circuit, and the mask 139 is a mask for protecting a channel forming region, a periphery thereof, and a storage capacitor of a semiconductor layer forming a TFT of a pixel portion.

With the ion doping conditions in the second doping process: a dosage of $1.5 \times 10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 126b to 128b as masks. Of course, phosphorous is not added to the regions covered by the masks 137 to 139. Thus, the second impurity regions 140 to 142 and the third impurity region 144 are formed. The impurity element imparting n-type conductivity is added to the second impurity regions 140 to 142 in a concentration range of $1 \times 10^{20}$ to $1 \times 10^{21}$/cm$^3$. Here, the region having the same concentration range as the second impurity region is also called an n$^+$ region.

Further, the third impurity region is formed at a lower concentration than that in the second impurity region by the first conductive layer, and is added with the impurity element imparting n-type conductivity in a concentration range of $1 \times 10^{18}$ to $1 \times 10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n$^-$ region. Furthermore, the regions covered by the masks 138 and 139 are not added with the impurity element in the second doping process, and become the first impurity regions 146 and 147.

Next, after the masks 137 to 139 made of resist are removed, masks 148 to 150 made of resist are newly formed, and the third doping process is conducted as shown in FIG. 7B.

In the driver circuit, by the third doping process as described above, the fourth impurity regions 151, 152 and the fifth impurity regions 153, 154 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 151 and 152 in a concentration range of $1 \times 10^{20}$ to $1 \times 10^{21}$/cm$^3$. Note that, in the fourth impurity regions 151, 152, phosphorous (P) has been added in the preceding step (n$^{--}$ region), but the impurity element imparting p-type conductivity is added at a concentration that is 1.5 to 3 times as high as that of phosphorous. Thus, the fourth impurity regions 151, 152 have a p-type conductivity. Here, the region having the same concentration range as the fourth impurity region is also called a p$^+$ region.

Further, the fifth impurity regions 153 and 154 are formed in regions overlapping the tapered portion of the second conductive layer 127a, and are added with the impurity element imparting p-type conductivity in a concentration range of $1 \times 10^{18}$ to $1 \times 10^{20}$/cm$^3$. Here, the region having the same concentration range as the fifth impurity region is also called a p$^-$ region.

Through the above-described steps, the impurity regions having n-type or p-type conductivity are formed in the respective semiconductor layers. The conductive layers 126 to 129 become gate electrodes of a TFT. Further, the conductive layer 130 becomes one of electrodes, which forms the storage capacitor in the pixel portion. Moreover, the conductive layer 131 forms a source wiring in the pixel portion.

Next, an insulating film (not shown) that covers substantially the entire surface is formed. In this example, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this example, a step of forming the insulating film may be conducted after the activation is conducted.

Next, the first interlayer insulating film 155 is formed of a silicon nitride film, and heat treatment (300 to 550° C. for 1 to 12 hours) is performed, thereby conducting a step of hydrogenating the semiconductor layers. (FIG. 7C) This step is a step of terminating dangling bonds of the semiconductor layers by hydrogen contained in the first interlayer insulating film 155. The semiconductor layers can be hydrogenated irrespective of the existence of an insulating film (not shown) formed of a silicon oxide film. Incidentally, in this example, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, the second interlayer insulating film 156 is formed from an organic insulating material on the first interlayer insulating film 155. In this example, an acrylic resin film with a thickness of 1.6 µm is formed. Then, a contact hole that reaches the source wiring 131, contact holes that respectively reach the conductive layers 129 and 130, and contact holes that reach the respective impurity regions are formed. In this example, a plurality of etching processes are sequentially performed. In this example, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings and pixel electrodes are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, source electrodes or drain electrodes 157 to 162, a gate wiring 164, a connection wiring 163, and a pixel electrode 165 are formed.

As described above, a driver circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate. (FIG. 8) In this specification, the above substrate is called an active matrix substrate for the sake of convenience.

In the pixel portion 207, the pixel TFT 204 (n-channel TFT) has a channel forming region 169, the first impurity region (n$^{--}$ region) 147 formed outside the conductive layer 129 forming the gate electrode, and the second impurity region (n$^+$ region) 142 and 171 functioning as a source region or a drain region. Further, in the semiconductor layer functioning as one of the electrodes of the storage capacitor 205, the fourth impurity region 152 and the fifth impurity region 154 are formed. The storage capacitor 205 is constituted of the second electrode 130 and the semiconductor layers 152, 154, and 170 with the insulating film (the same film as the gate insulating film) 116 as dielectric.

Further, in the driver circuit 206, the n-channel TFT 201 (the first n-channel TFT) has a channel forming region 166, the third impurity region (n$^-$ region) 144 that overlaps a part of the conductive layer 126 forming the gate electrode through the insulating film, and the second impurity region (n$^+$ region) 140 functioning as a source region or a drain region.

Further, in the driver circuit 206, the p-channel TFT 202 has a channel forming region 167, the fifth impurity region (p$^-$ region) 153 that overlaps a part of the conductive layer 127 forming the gate electrode through the insulating film, and the fourth impurity region (p$^+$ region) 151 functioning as a source region or a drain region.

Furthermore, in the driver circuit 206, the n-channel TFT 203 (the second n-channel TFT) has a channel-forming region 168, the first impurity region (n$^{--}$ region) 146 outside the conductive layer 128 forming the gate electrode, and the second impurity region (n$^+$ region) 141 functioning as a source region or a drain region.

The above TFTs 201 to 203 are appropriately combined to form a shift register circuit, a buffer circuit, a level shifter circuit, a latch ci forming the driver circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority.

Further, the reliability can be improved by improving the flatness of the semiconductor film surface. Thus, in the TFT having the GOLD structure, sufficient reliability can be obtained even if the area of the impurity region that overlaps the gate electrode through the gate insulating film is reduced. Specifically, in the TFT having the GOLD structure, sufficient reliability can be obtained even if the size of the portion that becomes the tapered portion of the gate electrode is reduced.

Further, In the TFT with the GOLD structure, a parasitic capacitance increases when the gate insulating film is thinned. However, the size of the tapered portion of the gate electrode (the first conductive layer) is reduced to reduce the parasitic capacitance, whereby the TFT becomes to enable high-speed operation with improved 'f' characteristic (Frequency characteristic) and to have sufficient reliability.

Note that, in the pixel TFT of the pixel portion 207 as well, the second laser light irradiation enables the reduction in off current and the reduction in fluctuation.

Further, an example of manufacturing the active matrix substrate for forming a reflection type display device is shown in this example. However, if the pixel electrode is formed of a transparent conductive film, a transmission type display device can be formed although the number of photomasks is increased by one.

Further, a glass substrate is used in this example; however, the substrate is not particularly limited to the glass one, quartz, a semiconductor, a ceramics and a metal one also can be used.

Figure 8:
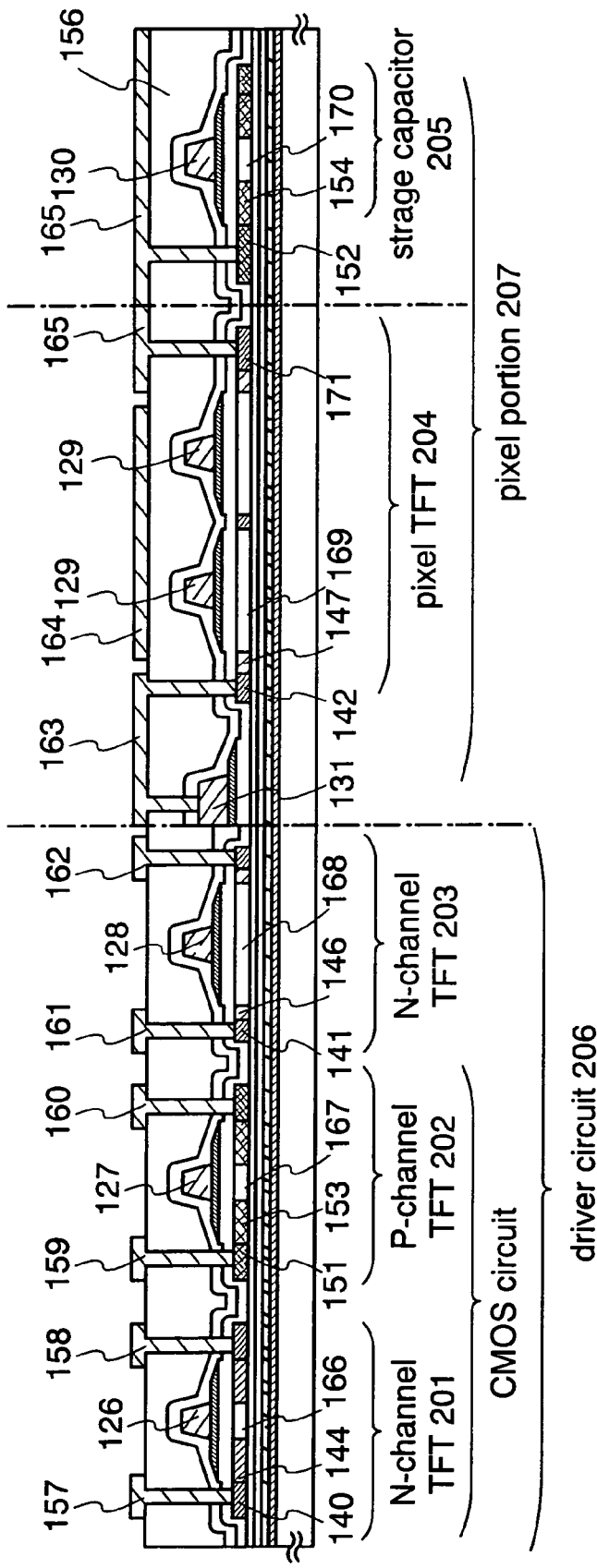
FIG. 8 is a view illustrating an active matrix substrate.

Furthermore, after obtain a state of FIG. 8, the substrate 100 can be peeled off if the mechanical strength of a layer containing TFT (peeled off layer) provided on the second material layer 102. The second material layer has a compression stress; and the first material has a tensile stress, so that the substrate 100 can be peeled off in a relatively small power. Due to the mechanical strength of the peeled off layer is insufficient, it is desirable to peel off after the peeled off layer is pasted to a support stand which is for fixation.

Example 2

In this example, the steps of fabricating an active matrix type liquid crystal display apparatus by peeling the substrate 100 from the active matrix substrate fabricated in Example 1 and sticking a plastic substrate will be described below. FIG. 9 will be used for the description.

Figure 9A:
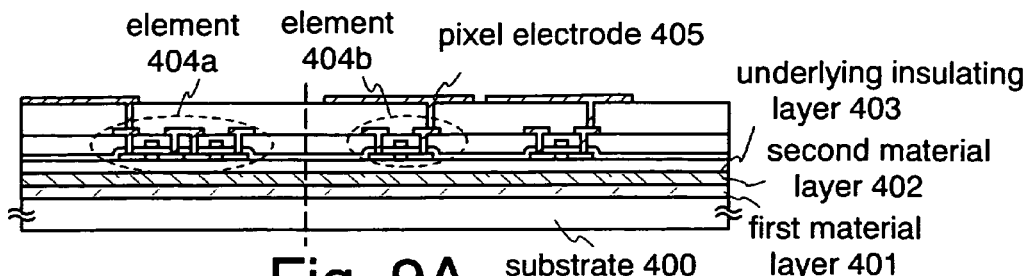
FIGS. 9A to 9D are views illustrating Example 2.

In FIG. 9A, the reference numeral 400 denotes a substrate, 401 denotes a first material layer, 402 denotes a second material layer, 403 denotes an underlying insulating layer, 404a denotes an element of a driving circuit 413, 404b denotes an element of a pixel portion 414, and 405 denotes a pixel electrode. Here, the term element, means a semiconductor element (typically TFT) to be employed as a switching element of a pixel, MIM element or the like. The active matrix substrate illustrated in FIG. 9A is a simplified active matrix substrate illustrated in FIG. 8 and the substrate 100 in FIG. 8 corresponds to the substrate 400 in FIG. 9A. Similarly, 401 in FIG. 9A corresponds to 101 in FIG. 8, 402 in FIG. 9A to 102 in FIG. 8, 403 in FIG. 9A to 103 in FIG. 8, 404a in FIG. 9A to 201 and 202 in FIG. 8, 404b in FIG. 9A to 204 in FIG. 8, and 405 in FIG. 9A to 165 in FIG. 8, respectively.

At first, according to Example 1, after the active matrix substrate in the state illustrated in FIG. 8 is obtained, an oriented film 406a is formed on the active matrix substrate illustrated in FIG. 8 and rubbing treatment is carried out. Incidentally, in this example, before formation of the oriented film, column-like spacers (not illustrated) for keeping a substrate gap are formed at desired positions by patterning an organic resin film such as an acrylic resin film. In place of the column-like spacers, spherical spacers may be applied to the entire face of the substrate.

Next, a counter substrate, which is to be a supporting body 407, is made ready. The counter substrate is equipped with a color filter (not illustrated) in which a coloring layer and a light shielding layer are arranged corresponding to respective pixels. A light shielding layer is also formed in the portions of the driving circuits. A leveling film (not illustrated) covering the color filter and the light shielding layer is formed. Next, a counter electrode 408 of a transparent film is formed in the pixel portion on the leveling film and an oriented film 406b is formed on the entire face of the counter substrate and rubbing treatment is carried out.

Figure 9B:
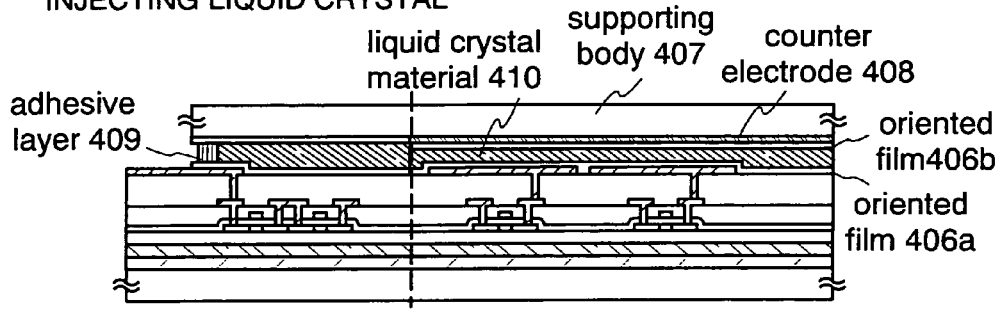

After that, the active matrix substrate 400 comprising the pixel portion and the driving circuits therein and the supporting body 407 are stuck to each other with a seal material, which becomes an adhesive layer 409. Filler is added to the seal material and owing to the filler and the column-like spacers, two substrates are stuck to each other at an even interval. Next, a liquid crystal material 410 is injected between both substrates and perfectly sealed by a sealing agent (not illustrated) (FIG. 9B). Any known liquid crystal material may be employed for the liquid crystal material 410.

Figure 9C:
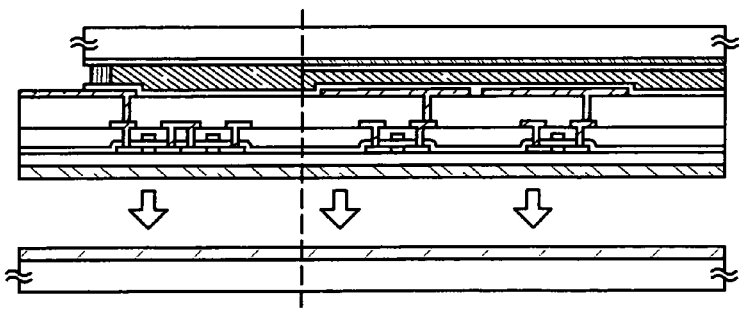
Figure 9D:
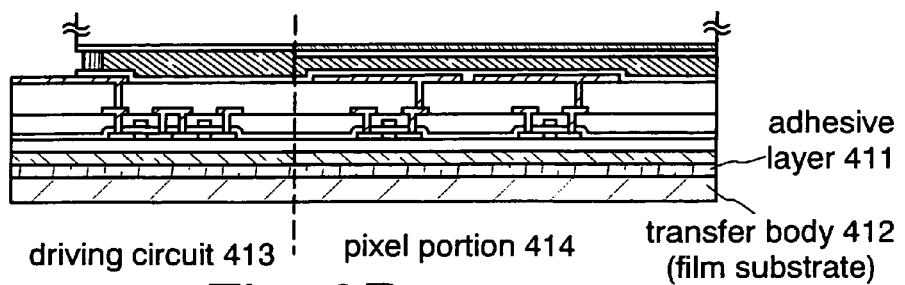

Next, the substrate 400 on which the first material layer is formed is peeled out (FIG. 9c). Since the second material layer 402 has compressive stress and the first material layer 401 has tensile stress, peeling can be carried out with a relatively slight force.

Next, the resulting body is stuck to a transfer body 412 through an adhesive layer 411 of epoxy resin or the like. In this example, the transfer body 412 is to be a plastic substrate to make it lightweight.

In such a manner, a flexible and active matrix type liquid crystal display apparatus is completed. If necessary, the flexible substrate 412 or the counter substrate is cut into a desired shape. Further, a polarizing plate (not illustrated) is properly arranged by employing a known technique. Also, FPC (not illustrated) is stuck by employing a known technique.

Example 3

In Example 2, examples with steps that are attaching the counter substrate as a supporting body, and then peeling off the substrate after injecting liquid crystals, finally sticking the plastic substrate as a transfer body, are described. In Example 3, examples that are, as shown in FIG. 8, after forming the active matrix substrate, peeling off the substrate, attaching a plastic substrate as a first transfer body and a plastic substrate as a second transfer body together, will be described below. FIG. 10 will be used for the description.

Figure 10A:
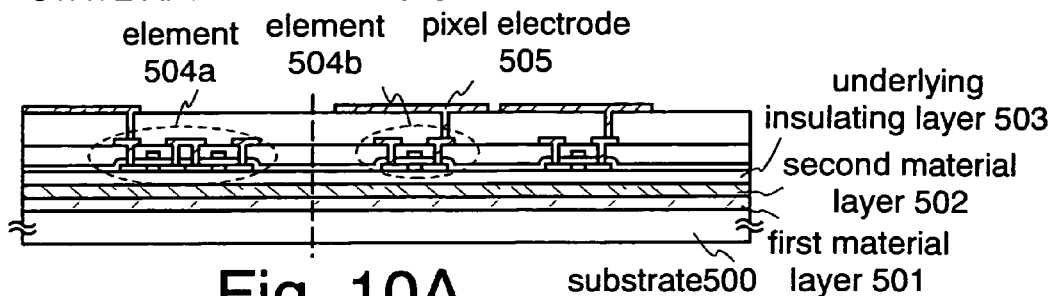
FIGS. 10A to 10E are views illustrating Example 3.

In FIG. 1A, the reference numeral 500 denotes a substrate, 501 denotes a first material layer, 502 denotes a second material layer, 503 denotes an underlying insulating layer, 504a denotes an element of a driving circuit 514, 504b denotes an element of a pixel portion 515, and 505 denotes a pixel electrode. The active matrix substrate illustrated in FIG. 10A is a simplified active matrix substrate illustrated in FIG. 8 and the substrate 100 in FIG. 8 corresponds to the substrate 500 in FIG. 10A. Similarly, 502 in FIG. 10A corresponds to 102 in FIG. 8, 503 in FIG. 10A to 103 in FIG. 8, 504a in FIG. 10A to 201 and 202 in FIG. 8, 504b in FIG. 10A to 204 in FIG. 8, and 505 in FIG. 10A to 165 in FIG. 8, respectively.

Figure 10B:
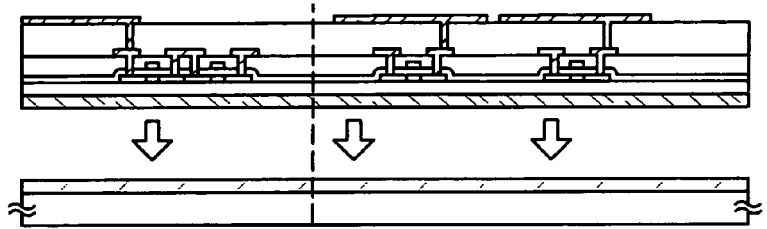

At first, according to Example 1, after the active matrix substrate in the state illustrated in FIG. 8 is obtained, the substrate 500 on which the first material layer is formed is peeled out (FIG. 10b). Since the second material layer 502 has compressive stress and the first material layer 501 has tensile stress, peeling can be carried out with a relatively slight force.

Figure 10C:
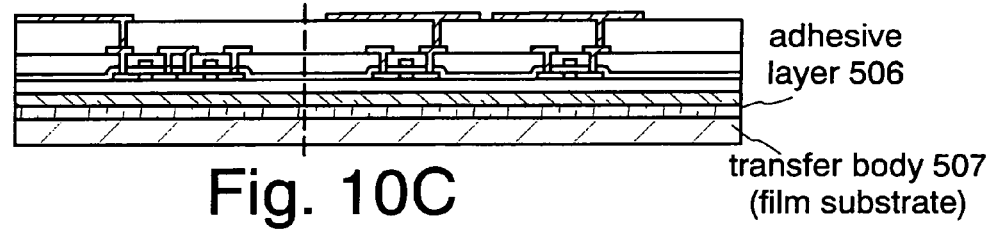

Next, the resulting body is stuck to a transfer body 507 (a first transfer body) through an adhesive layer 506 of epoxy resin or the like. In this example, the transfer body 507 is to be a plastic substrate to make it lightweight. (FIG. 10c)

Then, an alignment film 506a is formed and rubbing treatment is carried out. Incidentally, in this example, before formation of the alignment film, column-like spacers (not illustrated) for keeping a substrate gap are formed at desired positions by patterning an organic resin film such as an acrylic resin film. In place of the column-like spacers, spherical spacers may be applied to the entire face of the substrate.

Next, a counter substrate, which is to be a supporting body 510, is made ready. The counter substrate is equipped with a color filter (not illustrated) in which a coloring layer and a light shielding layer are arranged corresponding to respective pixels. A light shielding layer is also formed in the portions of the driving circuits. A leveling film (not illustrated) covering the color filter and the light shielding layer is formed. Next, a counter electrode 509 of a transparent film is formed in the pixel portion on the leveling film and an oriented film 508b is formed on the entire face of the counter substrate and rubbing treatment is carried out.

Figure 10D:
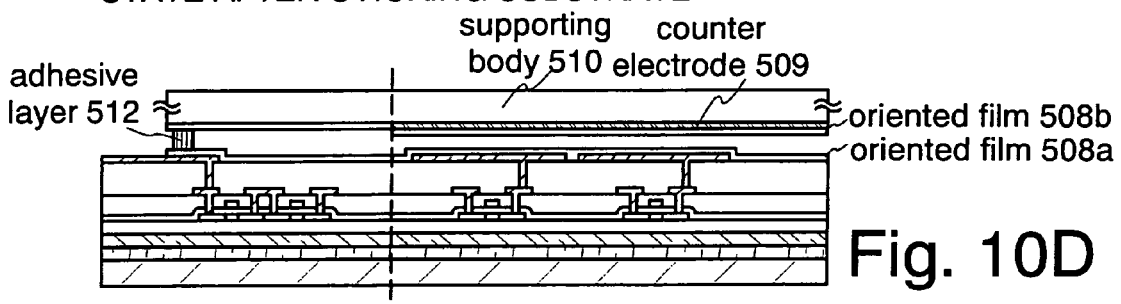
Figure 10E:
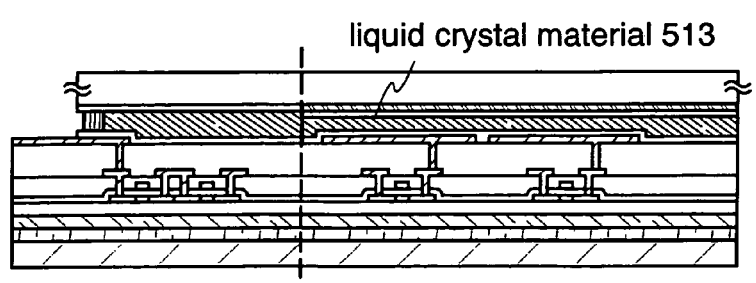

After that, the plastic film substrate 507 connecting the pixel portion and the driving circuits therein and the supporting body 510 are stuck to each other with a seal material, which becomes an adhesive layer 512. (FIG. 10D) Filler is added to the seal material and owing to the filler and the column-like spacers, two substrates are stuck to each other at an even interval. Next, a liquid crystal material 513 is injected between both substrates and perfectly sealed by a sealing agent (not illustrated) (FIG. 10D). Any known liquid crystal material may be employed for the liquid crystal material 513.

In such a manner, a flexible and active matrix type liquid crystal display apparatus is completed. If necessary, the flexible substrate 507 or the counter substrate is cut into a desired shape. Further, a polarizing plate (not illustrated) is properly arranged by employing a known technique. Also, FPC (not illustrated) is stuck by employing a known technique.

Example 4

Figure 11:
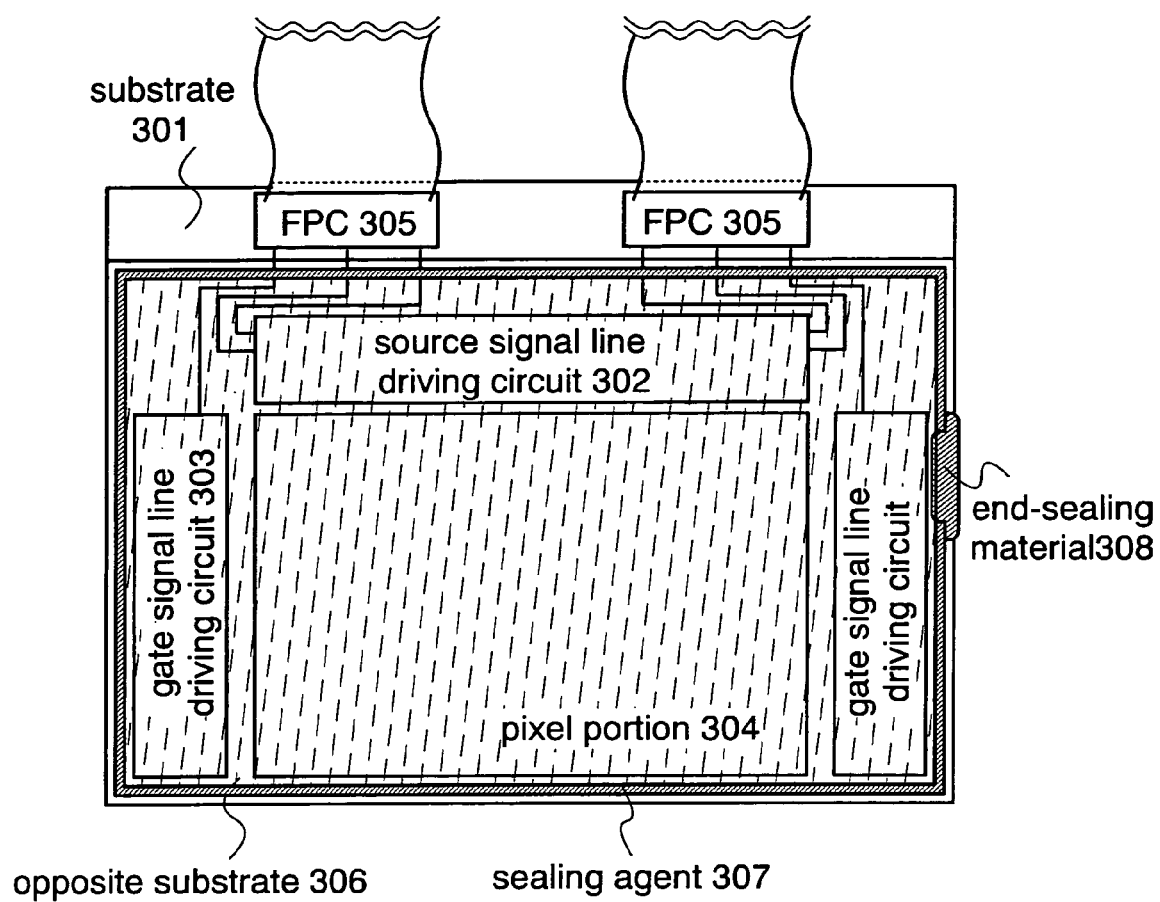
FIG. 11 is a view illustrating Example 4.

The structure of the obtained liquid crystal module according to the Example 2 or 3, is described with the reference to the top of view of FIG. 11. The substrate 507 according to the Example 2 or the substrate 507 according to the Example 3 corresponds to a substrate 301.

A pixel portion 304 is placed in the center of the substrate 301. A source single line driving circuit 302 for driving source signal lines is positioned above the pixel portion 304. Gate signal line driving circuits 303 for driving gate signal lines are placed to the left and right of the pixel portion 304. Although the gate signal line driving circuits 303 are symmetrical with respect to the pixel portion in this example, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 11 is preferred in terms of circuit operation reliability, driving efficiency, and the like.

Signals are inputted to the driving circuits from flexible printed circuits (FPC) 305. The FPCs 305 are press-fit through an anisotropic conductive film or the like after opening contact holes in the interlayer insulating film and resin film and forming a connection electrode 309 so as to reach the wiring lines arranged in given places of the substrate 301. The connection electrode is formed from ITO in this example.

A sealing agent 307 is applied to the substrate along its perimeter surrounding the driving circuits and the pixel portion. An opposite substrate 306 is bonded to the substrate 301 by the sealing agent 307 while a spacer 310 formed in advance on a film substrate keeps the distance between the two substrates constant. A liquid crystal material is injected through an area of the substrate that is not coated with the sealing agent 307. The substrates are then sealed by an end-sealing material 308. The liquid crystal module is completed through the above steps.

Although all of the driving circuits are formed on the substrate in the example shown here, several ICs may be used for some of the driving circuits.

This example can be implemented by freely combining with Example 1.

Example 5

Example 1 shows an exemplary reflection type display device in which a pixel electrode is made of a metal material with reflectivity. In this example, an exemplary transmission type display device is shown, in which a pixel electrode is made of a conductive film with light transparency.

The processes up to the process of forming an interlayer insulating film are the same as those in Example 1. Therefore, these processes will be omitted here. After the interlayer insulating film is formed in accordance with Example 1, a pixel electrode 601 made of a conductive film with light transparency is formed. As the conductive film having light transparency, ITO (indium tin oxide alloy), an indium oxide—zinc oxide alloy ($In_2O_3$—ZnO), zinc oxide (ZnO), or the like may be used.

Thereafter, contact holes are formed in the interlayer insulating film 600. Then, connection electrodes 602 overlapping the pixel electrodes are formed. The connection electrodes 602 are connected to drain regions through contact holes. Furthermore, a source region or a drain region of another TFT is also formed simultaneously with the connection electrodes.

Herein, an example in which all the driver circuits are formed on a substrate is shown. However, several ICs may be used in a part of a driver circuit.

Figure 12:
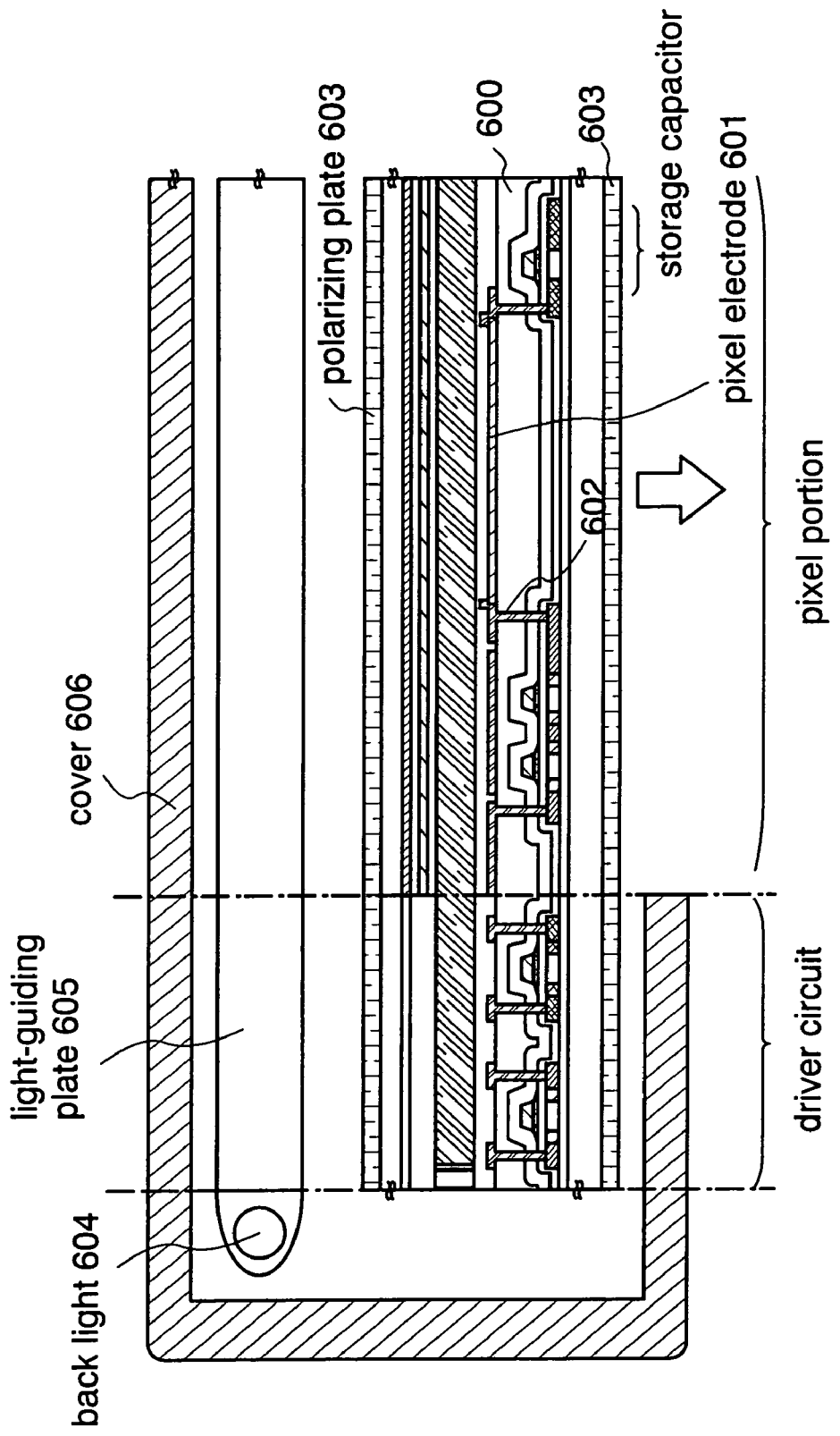
FIG. 12 is a view illustrating Example 5.

An active matrix substrate is formed as described above. Using the active matrix substrate, after peel off the substrate, a film having compression stress (not shown) and a plastic substrate are attached to each other, a liquid crystal module is manufactured in accordance with Examples 2 to 4, and a backlight 604 and a light-guiding plate 605 are provided, followed by disposing a cover 606, whereby an active matrix type liquid crystal display device as shown a part of a sectional view in FIG. 12 is completed. The cover 606 and the liquid crystal module are attached to each other with an adhesive or an organic resin. Furthermore, the plastic substrate may be attached to a counter substrate by filling an organic resin between a frame and a substrate so as to surround the frame. Since the apparatus is of a transmission type, polarizing plates 603 are attached to both the plastic substrate and the counter substrate. This example can be freely combined with Examples 1 to 4.

Example 6

In this example, an example of fabricating a light emitting apparatus equipped with EL (electro luminescence) elements formed on a plastic substrate will be described with the reference to FIG. 13.

Figure 13A:
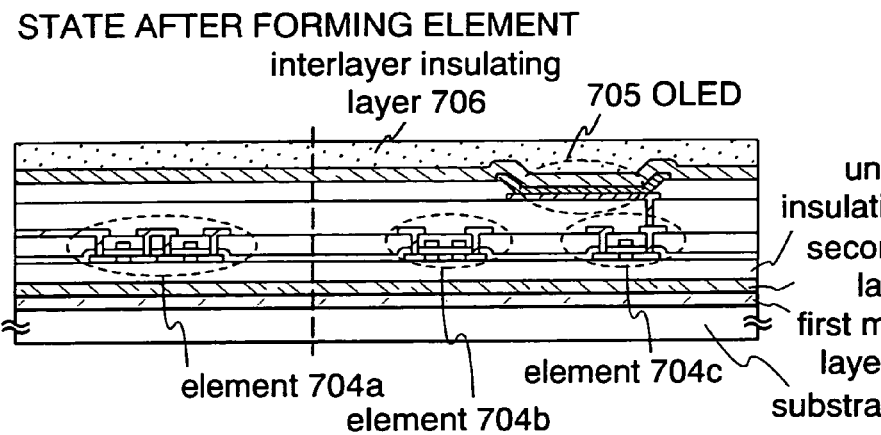
FIGS. 13A to 13D are views illustrating Example 6.

In FIG. 13A, the reference numeral 700 denotes a substrate, 701 denotes a first material layer, 702 denotes a second material layer, 703 denotes an underlying insulating layer, 704*a* denotes an element of a driving circuit 711, 704*b* and 704*c* denote elements of pixel portion 712, and 705 denotes OLED (organic light emitting device). In this case, the term, element, means a semiconductor element (typically TFT) to be employed as a switching element of a pixel in the case of an active matrix type light emitting device or a MIM element, OLED or the like. Covering these elements, an interlayer insulating layer 706 is formed. The interlayer insulating layer 706 is preferable to have more flat surface after film formation. Incidentally, the interlayer insulating layer 706 is not necessarily required to be formed.

According to any one of the embodiments 2 to 4, layers 701 to 703 may be formed on the substrate 700.

These elements (including 704*a*, 704*b*, and 704*c*) may be formed according to the n-channel type TFT 201 of the above-described Example 1 and the p-channel type TFT 202 of the above-described Example 1.

The OLED 705 comprises a layer (hereinafter, referred to as organic light emitting layer) containing an organic compound (an organic light emitting material) capable of providing electroluminescence generated by electric field application, an anode layer, and a cathode layer. The luminescence of organic compounds includes light emission (fluorescence) at the time of turning back to the basis state from the singlet excitation state and light emission (phosphorescence) at the time of turning back to the basis state from the triplet excitation state and the light emitting device of the invention may be based on either one of the light emission between both types of light emission or on both. In this specification, all of the layers formed between the anode and the cathode of the OLED are defined as an organic light emitting layer. The organic light emitting layer practically includes a light emitting layer, a hole injection layer, an electron injection layer, a hole transportation layer, an electron transportation layer and the like. Basically, the OLED has a layered structure of an anode/a light emitting layer/a cathode in this order and in addition to the structure, the OLED may have a layered structure of an anode/a hole injection layer/a light emitting layer/a cathode, or an anode/a hole injection layer/a light emitting layer/an electron transportation layer/a cathode in this order.

Figure 13B:
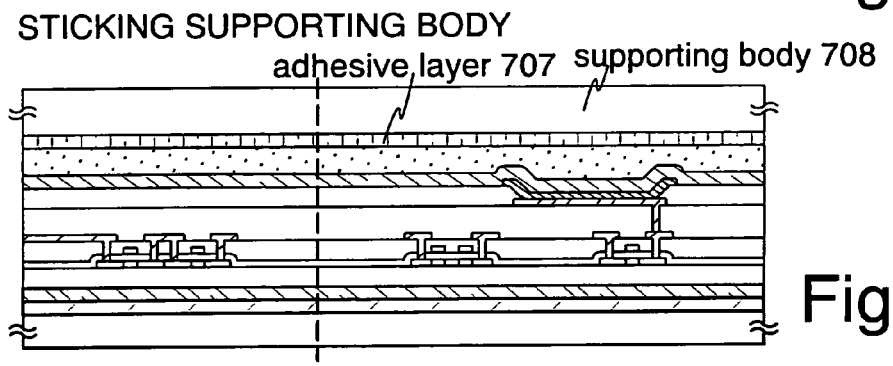

When the state illustrated in FIG. 13A is obtained by the above-described method, the supporting body 708 is stuck by the adhesive layer 707 (FIG. 13B). In this example, a plastic substrate is used as the supporting body 708. Practically, as the supporting body, a resin substrate with a thickness of 10 μm or thicker, for example, PES (polyethylene sulfone), PC (polycarbonate), PET (polyethylene terephthalate), or PEN (polyethylenenaphthalate) could be employed. In the case being positioned in the observer's side (the user side of the light emitting device) in relation to the OLED, the supporting body 708 and the adhesive layer 707 are required to be a light-transmissive material.

Figure 13C:
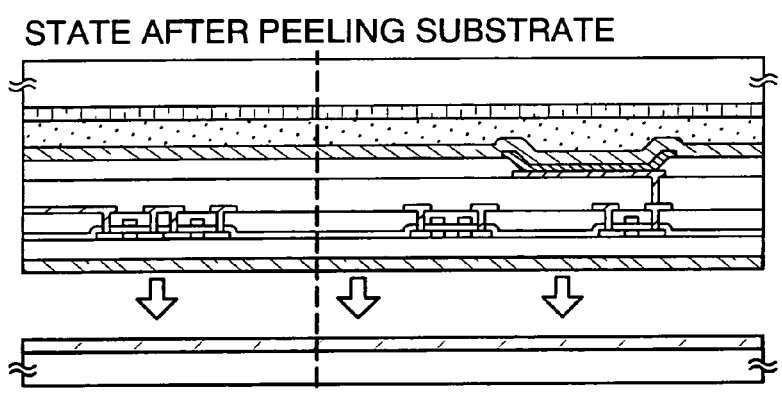

Next, the substrate 700 bearing the first material layer 701 thereon is peeled off by physical means (FIG. 13C). Since the second material layer 702 had a compressive stress and the first material layer 701 had a tensile stress, peeling could be carried out with relatively slight force.

Figure 13D:
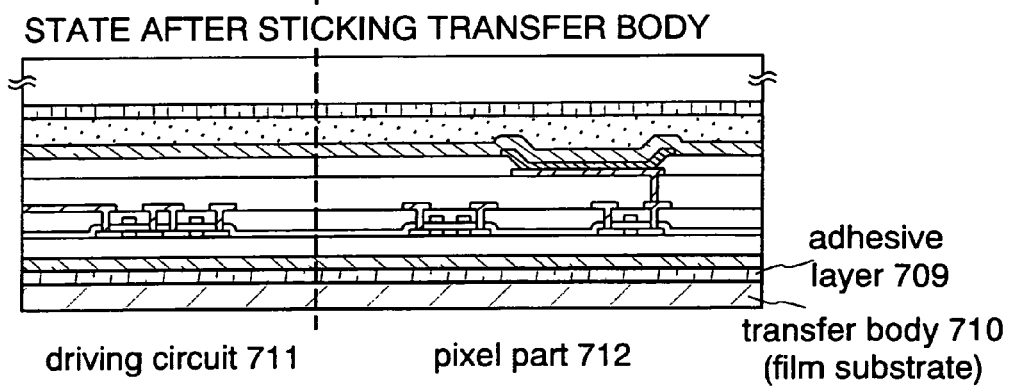

Next, the resulting substrate is stuck to a transfer body 710 by an adhesive layer 709 of epoxy resin or the like (FIG. 13D). In this example, the transfer body 710 is a plastic film substrate to make the weight light.

In such a manner, a flexible light emitting device sandwiched between a flexible supporting body 708 and a flexible transfer body 710 is obtained. Incidentally, if the supporting body 708 and the transfer body 710 are of a single material, the thermal expansion coefficient becomes equal and therefore, the device is made hard to be endurable to effects of stress strain by temperature change.

If necessary, the flexible supporting body 708 or the flexible transfer body 710 is cut into a desired shape. Also, FPC (not illustrated) is stuck by employing a known technique.

Example 7

In Example 6, the examples with the steps that are, attaching the supporting body, attaching a plastic substrate as a transfer body after peeling off the substrate, are described. In Example 7, an example of fabrication an EL (light emitting display device having elements) by the steps that are, peeling off the substrate, attaching a plastic substrate as a first transfer body and a plastic substrate as a second transfer body together, will be described. FIG. 14 will be used for the description.

Figure 14A:
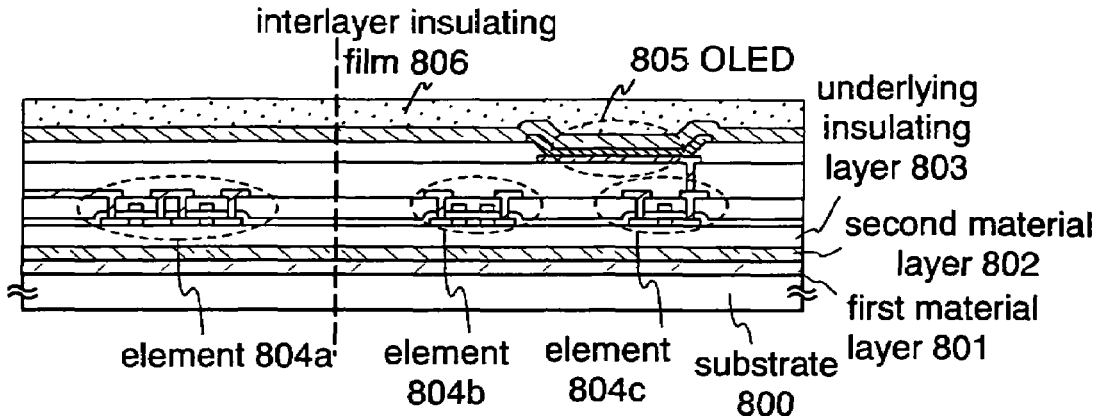
FIGS. 14A to 14C are views illustrating Example 7.

In FIG. 14A, the reference numeral 800 denotes a substrate, 801 denotes a first material layer, 802 denotes a second material layer, 803 denotes an underlying insulating layer, 404a denotes an element of a driving circuit 811, 804b and 804c denote elements of a pixel part 812, and 805 denotes a OLED (Organic Light Emitting Device). In this case, the term, element, means a semiconductor element (typically TFT) to be employed as a switching element of a pixel in the case of an active matrix type light emitting device or a MIM element, OLED or the like. An interlayer insulting film 806 is formed to cover all these elements. The interlayer insulating layer 806 is preferable to have more flat surface after film formation. Incidentally, the interlayer insulating layer 806 is not necessarily required to be formed.

According to any one of the Examples 2 to 4, layers 801 to 803 may be formed on the substrate 700.

These elements (including 804a, 804b, 804c) may be formed according to the n-channel type TFT 201 of the above-described Example 1 and the p-channel type TFT 202 of the above-described Example 1.

Figure 14B:
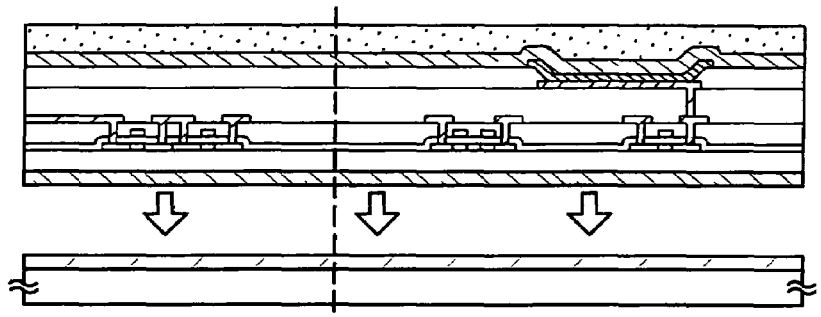
Figure 14C:
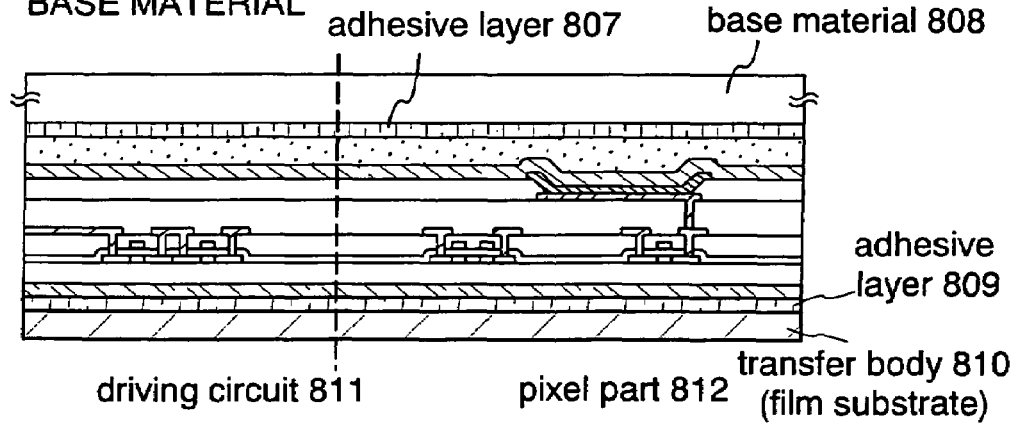

When the state illustrated in FIG. 14A is obtained by the above-described method, the substrate 800 bearing the first material layer 801 thereon is peeled off by physical means (FIG. 14B). Since the second material layer 802 have a compressive stress and the first material layer 801 have a tensile stress, peeling could be carried out with relatively slight force.

Next, the resulting substrate is stuck to a transfer body (the first transfer body) 810 by an adhesive layer 809 of epoxy resin or the like. In this example, the transfer body 810 is a plastic film substrate to make the weight light.

Next, the resulting substrate is stuck to a base material (a second transfer body) by an adhesive layer 807. (FIG. 14C) In this example, the plastic substrate is used as the base material 808. Practically, as the transfer body 810 and the base material 808, resin substrates with a thickness of 10 μm or thicker, for example, PES (polyethylene sulfone), PC (polycarbonate), PET (polyethylene terephthalate), or PEN (polyethylene naphthalate) can be employed. In the case being positioned in the observer's side (the user side of the light emitting device) in relation to the OLED, the base material 808 and the adhesive layer 807 are required to be a light-transmissive material.

In such a manner, a flexible light emitting device sandwiched between a flexible base material 808 and a flexible transfer body 810 is obtained. Incidentally, if the base material 808 and the transfer body 810 are of a single material, the thermal expansion coefficient become equal and therefore, the device is made hard to be endurable to effects of stress strain by temperature change.

If necessary, the flexible base material 808 or the flexible transfer body 810 is into a desired shape. Also, FPC (not illustrated) is stuck by employing a known technique.

Example 8

The structure of the obtained EL (Electro Luminescence) module according to Example 6 or 7 is described with the reference to the top of view of FIG. 15. The transcript body 810 according to the example corresponds to a film substrate 900.

Figure 15A:
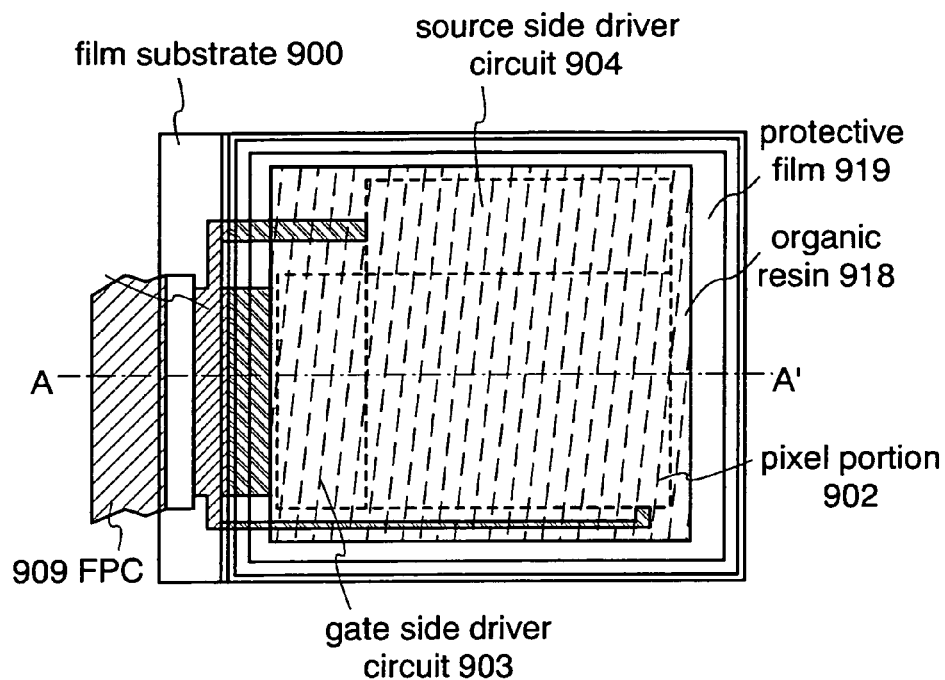
FIGS. 15A and 15B are view illustrating Example 8.
Figure 15B:
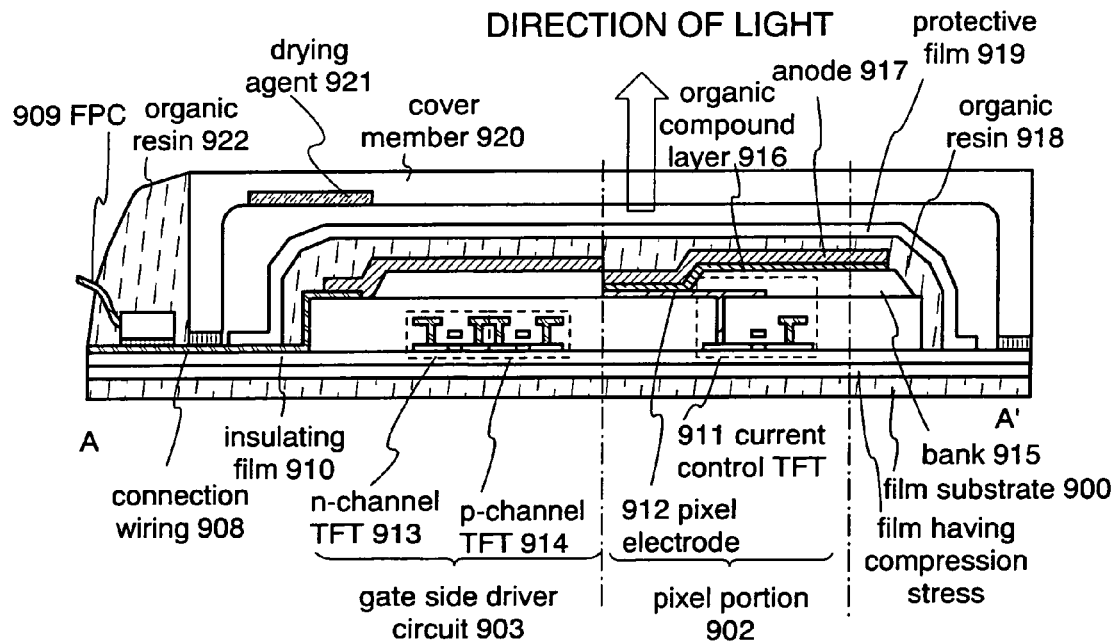

FIG. 15A is a top view of an EL module, and FIG. 15B is a sectional view taken along a line A-A' of FIG. 15A. In FIG. 15A, on a film substrate 900 having an flexibility (for example, a plastic substrate, or the like), a film 901 having compression stress (for example a Oxidation silicon film) is provided, and a pixel portion 902, a source side driver circuit 904, and a gate side driver circuit 903 are formed thereon. The pixel portion and the driver circuits can be obtained in accordance with the above-described Example 1 or 2.

Further, reference numeral 918 indicates an organic resin, and reference numeral 919 indicates a protective film. The pixel portion and the driver circuit portions are covered by the organic resin 918, and the organic resin is covered by the protective film 919. Further, the protective film 919 is sealed by a cover member 920 using an adhesive. The cover member 920 is connected before peeling off as a support stand. It is desirable that the cover member 920 is made of the same material as the substrate 900, for example, is a plastic substrate in order to withstand deformation due to heat or external force, and a material processed to have the concave shape (with a depth of 3 to 10 μm) as shown in FIG. 15B is used for the cover member 920. Further, it is desirable that the material is further processed to form a concave portion (with a depth of 50 to 200 μm) into which a drying agent 921 can be arranged. Further, in the case where multiple EL modules are manufactured, after the substrate and the cover member are attached with each other, segmentation may be conducted using a $CO_2$ laser or the like such that end surfaces match with each other.

Note that reference numeral 908 indicates a wiring for transmitting signals input to the source side driver circuit 904 and the gate side driver circuit 903, and receives a video signal and a clock signal from an FPC (flexible printed circuit) 909that is an external input terminal. Note that although only the FPC is shown in the figure, a printed wiring board (PWB) may be attached to the FPC. The light emitting device in this specification includes not only the main body of the light emitting device but also the light emitting device attached with the FPC or PWB.

Next, the sectional structure is described with reference to FIG. 15B. A film 901 having thermal conductivity is formed on the film substrate 900, and an insulating film 910 is provided thereon, the pixel portion 902 and the gate side driver circuit 903 are formed above the insulating film 910, and the pixel portion 902 is constituted of a plurality of pixels including a current control TFT 911 and a pixel electrode 912 electrically connected to a drain of the current control TFT 911. Further, the gate side driver circuit 903 is formed by using a CMOS circuit in which an n-channel TFT 913 and a p-channel TFT 914 are combined.

The above TFTs (including 911, 913, and 914) may be manufactured in accordance with the n-channel TFT and the p-channel TFT in Example 1.

Incidentally, after the pixel portion 902, the source side driver circuit 904 and the gate side driver circuit 903 are formed on the same substrate in accordance with Example 1 and 2, further, according to Embodiment mode, a support stand (here indicates a cover member) is connected, a substrate (not shown) is peeled off thereafter, and the film substrate 900 is attached.

Further, in a case that the cover member 920 is made for a concave shape as shown in FIG. 15B, after bonding the cover member 920 which becomes a support stand, the part of a wiring lead-out terminal (part of connection) becomes only the insulating film 910, So that the mechanical strength becomes weak, therefore, it is desirable to attach the FPC 909 before peeling off and to use a organic resin 922 for fixation.

Note that, as to a material of the insulating film provided between the TFT and the OLED, it is appropriate to use a material that not only blocks diffusion of impurity ions such as alkali metal ions or alkaline-earth metal ions but also positively adsorbs the impurity ions such as alkali metal ions or alkaline-earth metal ions, and further to use a material that can withstand a subsequent process temperature. As the material that satisfies the above conditions, a silicon nitride film containing a large amount of fluorine is given as an example. The concentration of fluorine contained in the silicon nitride film is $1 \times 10^{19}/cm^3$ or more, and preferably, the composition ratio of fluorine in the silicon nitride film is 1 to 5%. Fluorine in the silicon nitride film bonds to alkali metal ions or alkaline-earth metal ions, and is adsorbed into the film. Further, as another example, there is given an organic resin film containing particulates comprised of a stibium (Sb) compound, a stannum (Sn) compound or an indium (In) compound, which adsorbs alkali metal ions, alkaline-earth metal ions or the like, for example, an organic resin film containing particulates of stibiumpentoxide ($Sb_2O_5.nH_2O$). Note that this organic resin film contains particulates with an average particle size of 10 to 20 nm, and has high light transmission properties. The stibium compound typified by the stibium pentoxide particulates is likely to adsorb impurity ions such as alkali metal ions or alkaline-earth metal ions.

The pixel electrode 912 functions as a cathode of a light emitting element (OLED). Further, banks 915 are formed at both ends of the pixel electrode 912, and an organic compound layer 916 and an anode 917 of the light emitting element are formed on the pixel electrode 912.

As to the organic compound layer 916, a light emitting layer, a charge transportation layer and a charge injection layer may be freely combined to form an organic compound layer (layer for light emission and movement of carrier for light emission). For example, a low molecular weight organic compound material or a high molecular weight organic compound material may be used. Further, as the organic compound layer, a thin film formed from a light emitting material that emits light by singlet excitation (fluorescence) (singlet compound) or a thin film formed from a light emitting material that emits light by triplet excitation (phosphorescence) (triplet compound) can be used. Further, an inorganic material such as silicon carbide can be used for the charge transportation layer or the charge injection layer. Known materials can be used for the organic EL materials or inorganic materials.

An anode 917 also functions as a wiring common to all the pixels, and is electrically connected to the FPC 909 through the connection wiring 908. Further, all the elements contained in the pixel portion 902 and the gate side driver circuit 903 are covered by the anode 917, the organic resin 918 and the protective film 919.

Note that a material that is transparent or semitransparent to visible light is preferably used for the organic resin 918. Further, the organic resin 918 is desirably formed from a material that does not permeate moisture or oxygen as much as possible.

Further, after the light emitting element is completely covered by the organic resin 918, it is preferable that the protective film 919 is provided at least on the surface (exposed surface) of the organic resin 918 as shown in FIG. 15. Further, the protective film may be provided on the entire surface including the back surface of the substrate. Here, it is necessary to note that the protective film is not deposited to the portion where the external input terminal (FPC) is provided. A mask may be used in order not to form the protective film. Alternatively, the external input terminal portion may be covered by a tape formed of Teflon(registered trademark) or the like, which is used as a masking tape in a CVD apparatus, in order not to form the protective film.

The light emitting element is sealed by the protective film 919 with the above-described structure, whereby the light emitting element can be completely shut from the outside. Thus, it is possible to prevent a substance that promotes deterioration due to oxidization of the organic compound layer, such as moisture or oxygen from permeating from the outside. Additionally, divergence from a film having thermal conductivity can be emitted. Therefore, the light emitting device with high reliability can be obtained.

Figure 16:
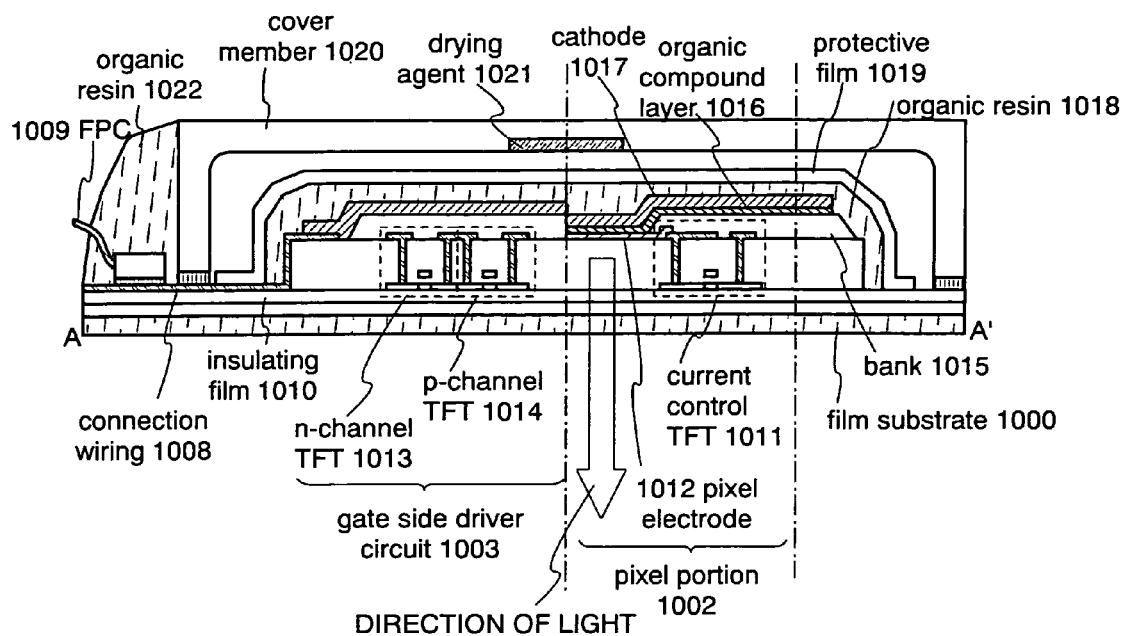
FIG. 16 is a view illustrating Example 8.

Further, the structure may be adopted in which a pixel electrode is an anode, and an organic compound layer and a cathode are laminated to thereby provide light emission in an opposite direction to that in FIG. 15. FIG. 16 shows an example thereof. Note that a top view of the example is the same as that of FIG. 15, and thus is omitted.

A sectional structure shown in FIG. 16 is described below. An insulating film 1010 is provided on a film substrate 1000, a pixel portion 1002 and a gate side driver circuit 1003 are formed above the insulating film 1010, the pixel portion 1002 is constituted of a plurality of pixels including a current control TFT 1011 and a pixel electrode 1012 electrically connected to a drain of the current control TFT 1011. Note that in accordance with Embodiment mode, after a peeled off layer formed on the substrate is peeled off, the film substrate 1000 is attached. Further, the gate side driver circuit 1003 is formed by using a CMOS circuit in which an n-channel TFT 1013 and a p-channel TFT 1014 are combined.

These TFTs (including 1011, 1013, 1014) can be manufactured according to the n-channel TFT 201, p-channel TFT 202 of the above Example 1.

The pixel electrode 1012 functions as an anode of a light emitting element. Further, banks 1015 are formed at both ends of the pixel electrode 1012, and an organic compound layer 1016 and an anode 1017 of the light emitting element are formed on the pixel electrode 1012.

The cathode 1017 also functions as a wiring common to all the pixels, and is electrically connected to an FPC 1009 via a connection wiring 1008. Further, all the elements contained in the pixel portion 1002 and the gate side driver circuit 1003 are covered by the cathode 1017, an organic resin 1018 and a protective film 1019. Further, a cover member 1020 is bonded by an adhesive. In addition, a concave portion is provided in the cover member, and a drying agent 1021 is arranged therein.

Further, in a case that the cover member 1020 is made for a concave shape as shown in FIG. 16, after bonding the cover member 1020 which becomes a support stand, the part of a wiring lead-out terminal (part of connection) becomes only the insulating film 1010, So that the mechanical strength becomes weak, therefore, it is desirable to attach the FPC 1009 before peeling off and to use an organic resin 922 for fixation.

Further, in FIG. 16, the pixel electrode is the anode, and the organic compound layer and the cathode are laminated. Thus, the light emission direction is indicated by an arrow in FIG. 16.

Note that although a top gate TFT is described as an example in Example 8, however, the present invention can be applied regardless of the structure of TFT, a bottom gate (inverted stagger) TFT and a stagger TFT also can be applied as examples.

Example 9

In Example 8, an example of using a top gate type TFT is exemplified, however it is also possible to use a bottom gate type TFT. Here an example of using the bottom gate type TFT will be exemplified as illustrated in FIG. 17.

Figure 17:
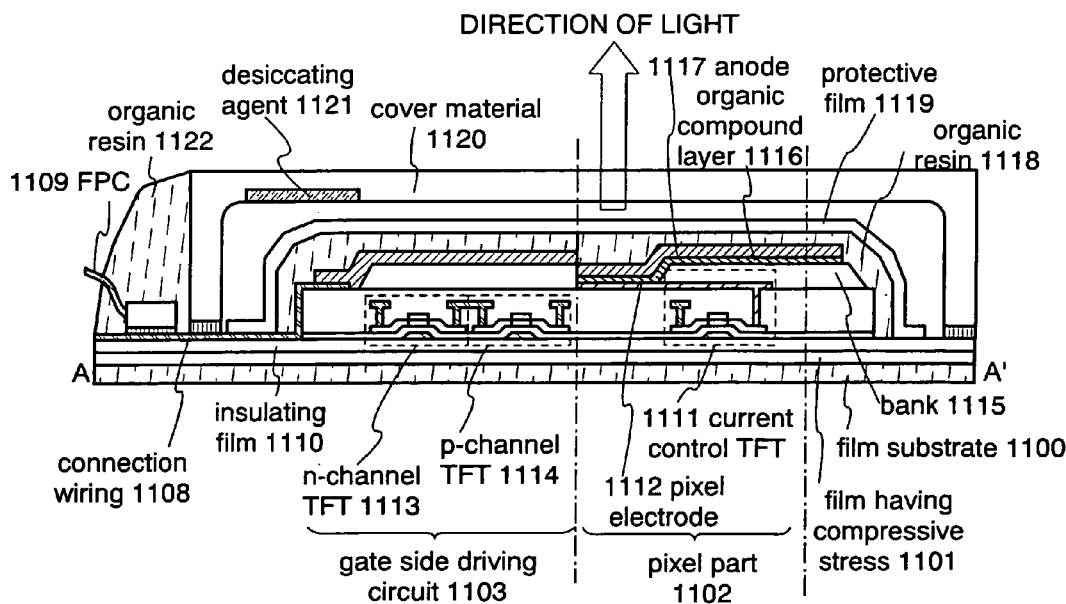
FIG. 17 is a view illustrating Example 9.

As illustrated in FIG. 17, all of an n-channel type TFT 1113, a p-channel type TFT 1114, and an n-channel type TFT 1111 are all made to have a bottom gate structure. Their bottom gate structure could be fabricated by known technique. Incidentally, active layers of these TFT may be a semiconductor film (polysilicon or the like) having a crystal structure or a semiconductor film (amorphous silicon or the like) having an amorphous structure.

Further, in FIG. 17, the reference numeral 1100 denotes a flexible film substrate (e.g., a plastic substrate or the like), 1101 denotes a film having a compressive stress (e.g., a silicon oxide film), 1102 denotes a pixel part, 1103 denotes a gate side driving circuit, 1110 denotes an insulating film, 1112 denotes a pixel electrode (a cathode), 1115 denotes a bank, 1116 denotes an organic compound layer, 1117 denotes an anode, 1118 denotes organic resin, 1119 denotes a protective film, 1120 denotes a cover material, 1121 denotes a desiccating agent, and 1122 denotes organic resin.

Since the structure other than the n-channel type TFT 1113, the p-channel type TFT 1114, and the n-channel type TFT 1111 is same as that of Example 8, its description will be omitted here.

Example 10

Driver circuits and pixel portions formed by implementing the present invention can be used in various modules (active matrix type liquid crystal module, active matrix type EL module and active matrix type EC module). That is, the present invention can be implemented in all of electronic equipments integrated with the modules at display portions thereof.

As such electronic equipments, there are pointed out a video camera, a digital camera, a head mount display (goggle type display), a car navigation system, a projector, a car stereo, a personal computer, a portable information terminal (mobile computer, cellular phone or electronic book) and the like. Examples of these are shown in FIGS. 18 and 19.

Figures 18A, 18B:
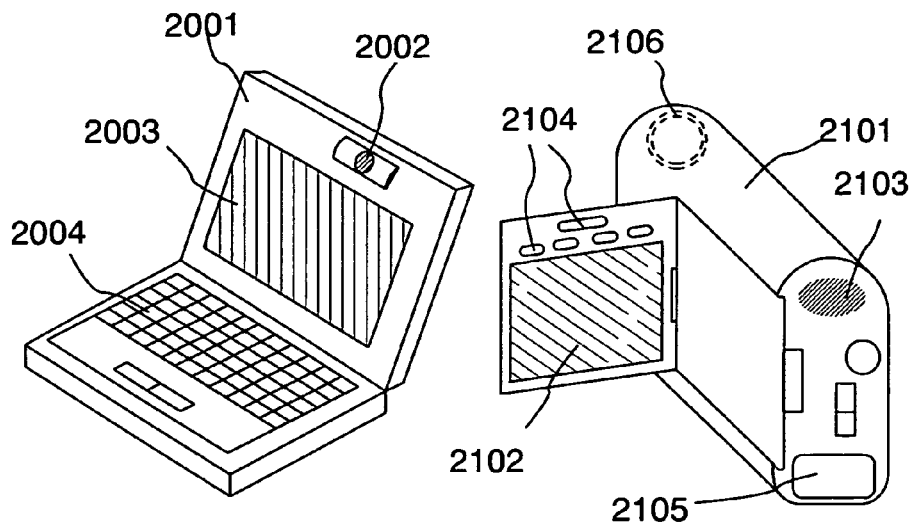
FIGS. 18A to 18F are views illustrating examples of electronic appliances.

FIG. 18A shows a personal computer including a main body 2001, an image input portion 2002, a display portion 2003 and a keyboard 2004. The present invention can be applied to the display portion 2003.

FIG. 18B shows a video camera including a main body 2101, a display portion 2102, a voice input portion 2103, operation switches 2104, a battery 2105 and an image receiving portion 2106. The present invention can be applied to the display portion 2102.

Figures 18C, 18D:
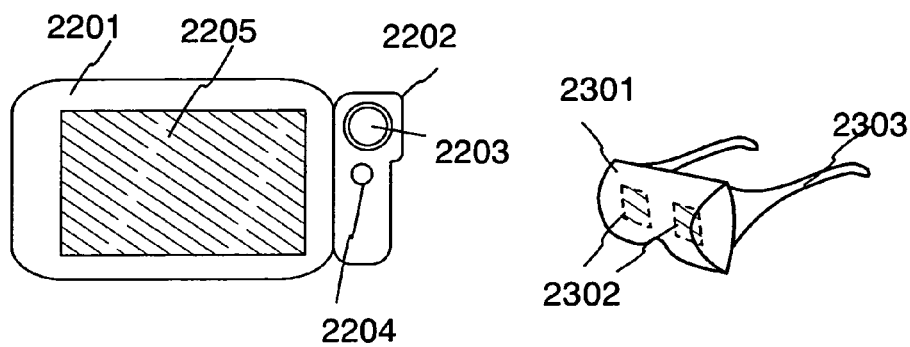

FIG. 18C shows a mobile computer including a main body 2201, a camera portion 2202, an image receiving portion 2203, an operation switch 2204 and a display portion 2205. The present invention can be applied to the display portion 2205.

FIG. 18D shows a goggle type display including a main body 2301, a display portion 2302 and an arm portion 2303. The present invention can be applied to the display portion 2302.

Figures 18E, 18F:
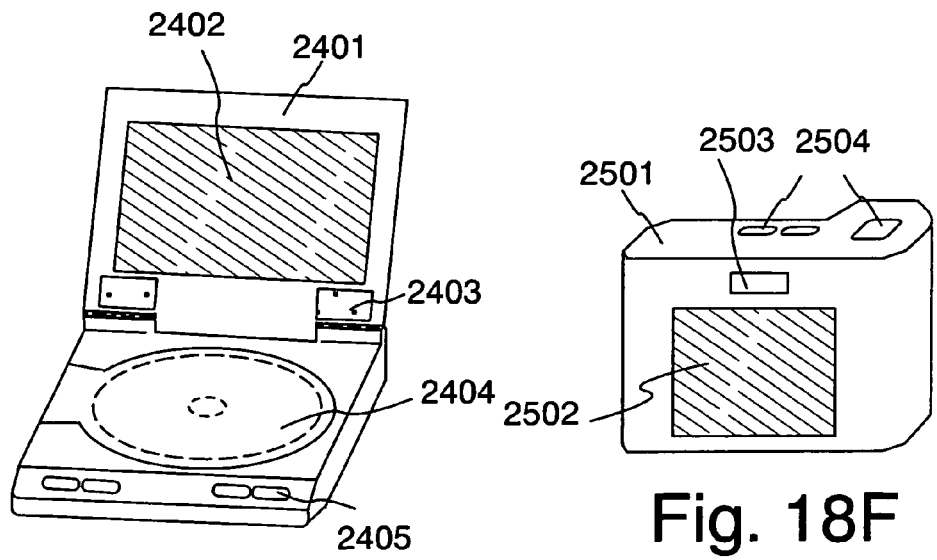

FIG. 18E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet. The present invention can be applied to the display portion 2402.

FIG. 18F shows a digital camera including a main body 2501, a display portion 2502, an eye contact portion 2503, operation switches 2504 and an image receiving portion (not illustrated). The present invention can be applied to the display portion 2502.

Figure 19A:
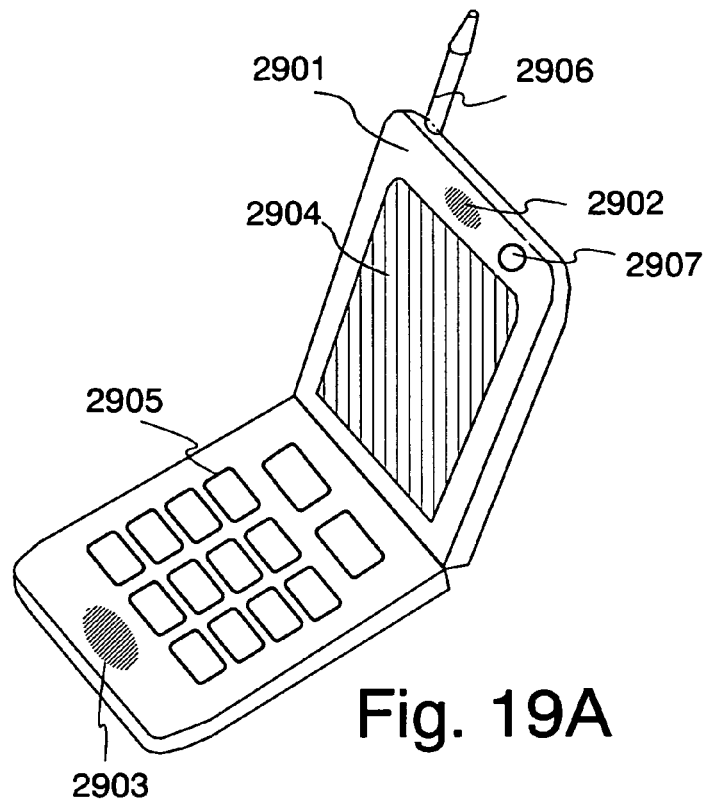
FIGS. 19A to 19C are views illustrating examples of electronic appliances.

FIG. 19A shows a cellular phone including a main body 2901, a sound output portion 2902, a sound input portion 2903, a display portion 2904, an operation switch 2905, an antenna 2906 and an image input portion (CCD, image sensor or the like) 2907. The present invention can be applied to display portion 2904.

Figure 19B:
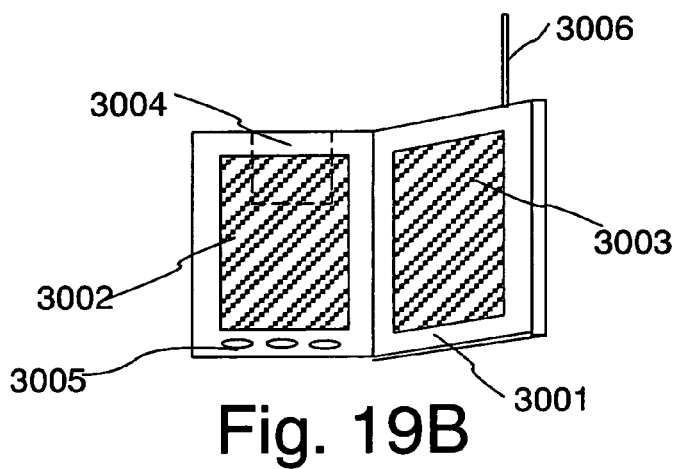

FIG. 19B shows a portable book (electronic book) including a main body 3001, display portions 3002 and 3003, a record medium 3004, an operation switch 3005 and an antenna 3006. The present invention can be applied to display portions 3002 and 3003.

Figure 19C:
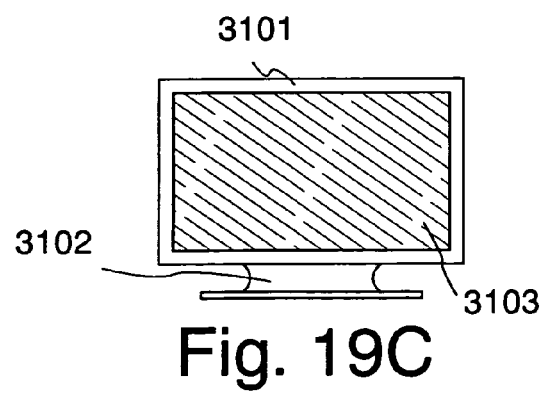

FIG. 19C shows a display including a main body 3101, a support base 3102 and a display portion 3103. The present invention can be applied to display portion 3103.

In addition, the display shown in FIG. 19C is small and medium type or large type, for example, screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic equipment of all the fields. The electronic equipment of the present invention can be implemented by freely combined with the structures in Examples 1 to 9.

Example 11

In this example, an example of using an electrophoresis display device as a display portion illustrated in Example 10. Typically, the electrophoresis display device is applied to a display portion 3002 or a display portion 3003 of a portable book (electronic book) shown in FIG. 19B.

The electrophoresis display device is also referred to as an electronic paper. It has advantages of readability that is the same as papers, a low power consumption in comparison with other display devices, and shape of thin and light.

The electrophoresis display device can takes a various forms such as that the plural micro capsules containing the first particle with plus electric charge and the second particle with minus electric charge is dispersed in the solvent or solute. By applying electric field to the micro capsule, particles in the micro capsule is removed inversed direction each other so that the color of particles gathered one side are emitted. In addition, the first particle and the second particle contain dyestuffs. The particles do not remove without electric field. Further, the color of the first particle and the second particle are different each other (including colorless).

Thus, the electrophoresis display device uses so-called dielectric migration effect that high dielectric invariable materials are moving to high electric field region. The electrophoresis display device is not necessary a reflection plate and a opposite substrate that are necessary for a liquid crystal display device so that the thickness and weight are reduced by half.

Dispersed micro capsules in solvent is referred to as an electronic ink. The electronic ink can be printed on a surface of a glass, a plastic, a cloth and a paper. Further, a color display is possible by using particles having a color filter and a pigment.

An active matrix type display device can be completed by providing appropriately above-mentioned plural micro capsules between two electrodes. If an electric field is applied to the micro capsule, the device can display images.

The first particle and the second particle in the micro capsule can be formed by one kind of materials or compound materials selected from the following materials; conductive materials, insulating materials, semiconductor materials, magnetism materials, liquid crystal materials, ferroelectric materials, electro luminescent materials, electrochromic materials, and magnetic electrophoresis materials.

This Example can be freely combined with Embodiments 1 to 4, and Examples 1 to 10.

In the present invention, peeling of a substrate is carried out by physical means, so that no damage on a semiconductor layer is caused and the reliability of elements can be improved.

Further, the invention is capable of carrying out peeling at a high yield ratio of not only a peeled off layer with a small surface area but also a peeled off layer with a large surface area in the entire surface.

In addition to that, the invention is made it possible to carry out peeling easily with physical means, for example, by hands of a man, so that the process of the invention can be said suitable for mass production. Further, in the case a manufacturing apparatus for peeling a peeled off layer for the mass production is manufactured, even a large scale manufacturing apparatus can be manufactured at a low cost.

What is claimed is:

1. A method for peeling comprising the steps of:
   forming a multilayer composed of a first material layer over a substrate and a second material layer over the first material layer over the substrate;
   heating at 500° C. or higher the multilayer so that the second material layer has a compressive stress; and
   peeling the second material layer from the first material layer and the substrate after the heating step,
   wherein the second material layer has the compressive stress in a range of $-1$ to $-1\times10^{10}$ Dyne/cm$^2$ before the peeling step.

2. The method for peeling according to claim 1, wherein the first material layer comprises metal material.

3. The method for peeling according to claim 1, wherein the first material layer comprises tungsten.

4. The method for peeling according to claim 1, wherein the second material layer comprises silicon.

5. The method for peeling according to claim 1, wherein the peeling step is carried out by physical means.

6. A method for peeling comprising the steps of:
   forming a multilayer composed of a first material layer over a substrate and a second material layer over the first material layer over the substrate;
   radiating a laser beam to the multilayer so that the second material layer has a compressive stress; and
   peeling the second material layer from the first material layer and the substrate after the radiating step,
   wherein the second material layer has the compressive stress in a range of $-1$ to $-1\times10^{10}$ Dyne/cm$^2$ before the peeling step.

7. The method for peeling according to claim 6, wherein the first material layer comprises metal material.

8. The method for peeling according to claim 6, wherein the first material layer comprises tungsten.

9. The method for peeling according to claim 6, wherein the second material layer comprises silicon.

10. The method for peeling according to claim 6, wherein the peeling step is carried out by physical means.

11. A method for peeling comprising the steps of:
    forming a multilayer composed of a first material layer over a substrate and a second material layer over the first material layer over the substrate;
    forming an underlying insulating layer on the multilayer;
    forming a semiconductor layer having an amorphous structure on the underlying insulating layer;
    heating the multilayer, the underlying insulating layer and the semiconductor layer so that the second material layer has a compressive stress; and
    peeling the second material layer, the underlying insulating layer and the semiconductor layer from the first material layer and the substrate after the heating step,
    wherein the second material layer has the compressive stress in a range of $-1$ to $-1\times10^{10}$ Dyne/cm$^2$ before the peeling step.

12. The method for peeling according to claim 11, wherein the first material layer comprises metal material.

13. The method for peeling according to claim 11, wherein the first material layer comprises tungsten.

14. The method for peeling according to claim 11, wherein the second material layer comprises silicon.

15. The method for peeling according to claim 11, wherein the underlying insulating layer comprises two silicon nitride oxide films.

16. The method for peeling according to claim 11, wherein the peeling step is carried out by physical means.

17. A method for peeling comprising the steps of:
    forming a multilayer composed of a first material layer over a substrate and a second material layer over the first material layer over the substrate;
    forming an underlying insulating layer on the multilayer;

forming a semiconductor layer having an amorphous structure on the underlying insulating layer;

radiating a laser light to the multilayer, the underlying insulating layer and the semiconductor layer so that the second material layer has a compressive stress; and peeling the second material layer, the underlying insulating layer and the semiconductor layer from the first material layer and the substrate after the radiating step, wherein the second material layer has the compressive stress in a range of $-1$ to $-1\times10^{10}$ Dyne/cm$^2$ before the peeling step.

18. The method for peeling according to claim 17, wherein the first material layer comprises metal material.

19. The method for peeling according to claim 17, wherein the first material layer comprises tungsten.

20. The method for peeling according to claim 17, wherein the second material layer comprises silicon.

21. The method for peeling according to claim 17, wherein the underlying insulating layer comprises two silicon nitride oxide films.

22. The method for peeling according to claim 17, wherein the peeling step is carried out by physical means.

23. A method for peeling comprising the steps of:
forming a multilayer composed of a first material layer over a substrate and a second material layer over the first material layer over the substrate;

heating the multilayer so that the second material layer has a compressive stress;

sticking a supporting body to the multilayer; and peeling the second material layer and the supporting body from the first material layer and the substrate after the heating step, wherein the second material layer has the compressive stress in a range of $-1$ to $-1\times10^{10}$ Dyne/cm$^2$ before the peeling step.

24. The method for peeling according to claim 23, wherein the first material layer comprises metal material.

25. The method for peeling according to claim 23, wherein the first material layer comprises tungsten.

26. The method for peeling according to claim 23, wherein the second material layer comprises silicon.

27. The method for peeling according to claim 23, wherein the peeling step is carried out by physical means.

28. The method for peeling according to claim 23, wherein the supporting body is a film-like plastic substrate.

29. A method for peeling comprising the steps of:
forming a multilayer composed of a first material layer over a substrate and a second material layer over the first material layer over the substrate;

radiating a laser light to the multilayer so that the second material layer has a compressive stress;

sticking a supporting body to the multilayer; and peeling the second material layer and the supporting body from the first material layer and the substrate after the radiating step, wherein the second material layer has the compressive stress in a range of $-1$ to $-1\times10^{10}$ Dyne/cm$^2$ before the peeling step.

30. The method for peeling according to claim 29, wherein the first material layer comprises metal material.

31. The method for peeling according to claim 29, wherein the first material layer comprises tungsten.

32. The method for peeling according to claim 29, wherein the second material layer comprises silicon.

33. The method for peeling according to claim 29, wherein the peeling step is carried out by physical means.

34. The method for peeling according to claim 29, wherein the supporting body is a film-like plastic substrate.

* * * * *